(12) United States Patent
Wang et al.

(10) Patent No.: US 7,824,519 B2
(45) Date of Patent: Nov. 2, 2010

(54) VARIABLE VOLUME PLASMA PROCESSING CHAMBER AND ASSOCIATED METHODS

(75) Inventors: Ing-Yann Albert Wang, Moraga, CA (US); Robert Chebi, San Carlos, CA (US)

(73) Assignee: Lam Research Corporation, Fremont, CA (US)

(*) Notice: Subject to any disclaimer, the term of this patent is extended or adjusted under 35 U.S.C. 154(b) by 556 days.

(21) Appl. No.: 11/750,985

(22) Filed: May 18, 2007

(65) Prior Publication Data

US 2008/0286489 A1    Nov. 20, 2008

(51) Int. Cl.
    C23F 1/00        (2006.01)
    H01L 21/306      (2006.01)
    C23C 16/00       (2006.01)
(52) U.S. Cl. .................................. 156/345.1; 118/723 R
(58) Field of Classification Search ............ 156/345.43, 156/345.44, 345.45, 345.46, 345.47; 118/715, 118/722, 723 R, 723 E; 315/111.21
See application file for complete search history.

(56) References Cited

U.S. PATENT DOCUMENTS

| | | | |
|---|---|---|---|
| 6,350,317 B1 * | 2/2002 | Hao et al. ..................... | 118/71 |
| 6,433,484 B1 * | 8/2002 | Hao et al. ............... | 315/111.21 |
| 6,984,288 B2 * | 1/2006 | Dhindsa et al. ........ | 156/345.47 |
| 7,156,047 B2 | 1/2007 | Kang et al. | |
| 7,578,258 B2 * | 8/2009 | Fischer ................... | 118/723 R |
| 2006/0011138 A1 * | 1/2006 | Kang et al. ............. | 118/723 R |
| 2006/0278340 A1 * | 12/2006 | Fischer .................. | 156/345.47 |

* cited by examiner

Primary Examiner—Parviz Hassanzadeh
Assistant Examiner—Maureen Gramaglia
(74) Attorney, Agent, or Firm—Martine Penilla & Gencarella, LLP

(57) ABSTRACT

A plasma processing chamber includes a substrate support having a top surface defined to support a substrate in a substantially horizontal orientation within the chamber. The plasma processing chamber also includes a number of telescopic members disposed within the chamber outside a periphery of the substrate support. The number of telescopic members are also disposed in a concentric manner with regard to a center of the top surface of the substrate support. Each of the number of telescopic members is defined to be independently moved in a substantially vertical direction so as to enable adjustment of an open volume above the top surface of the substrate support, and thereby enable adjustment of a plasma condition within the open volume above the top surface of the substrate support.

11 Claims, 20 Drawing Sheets

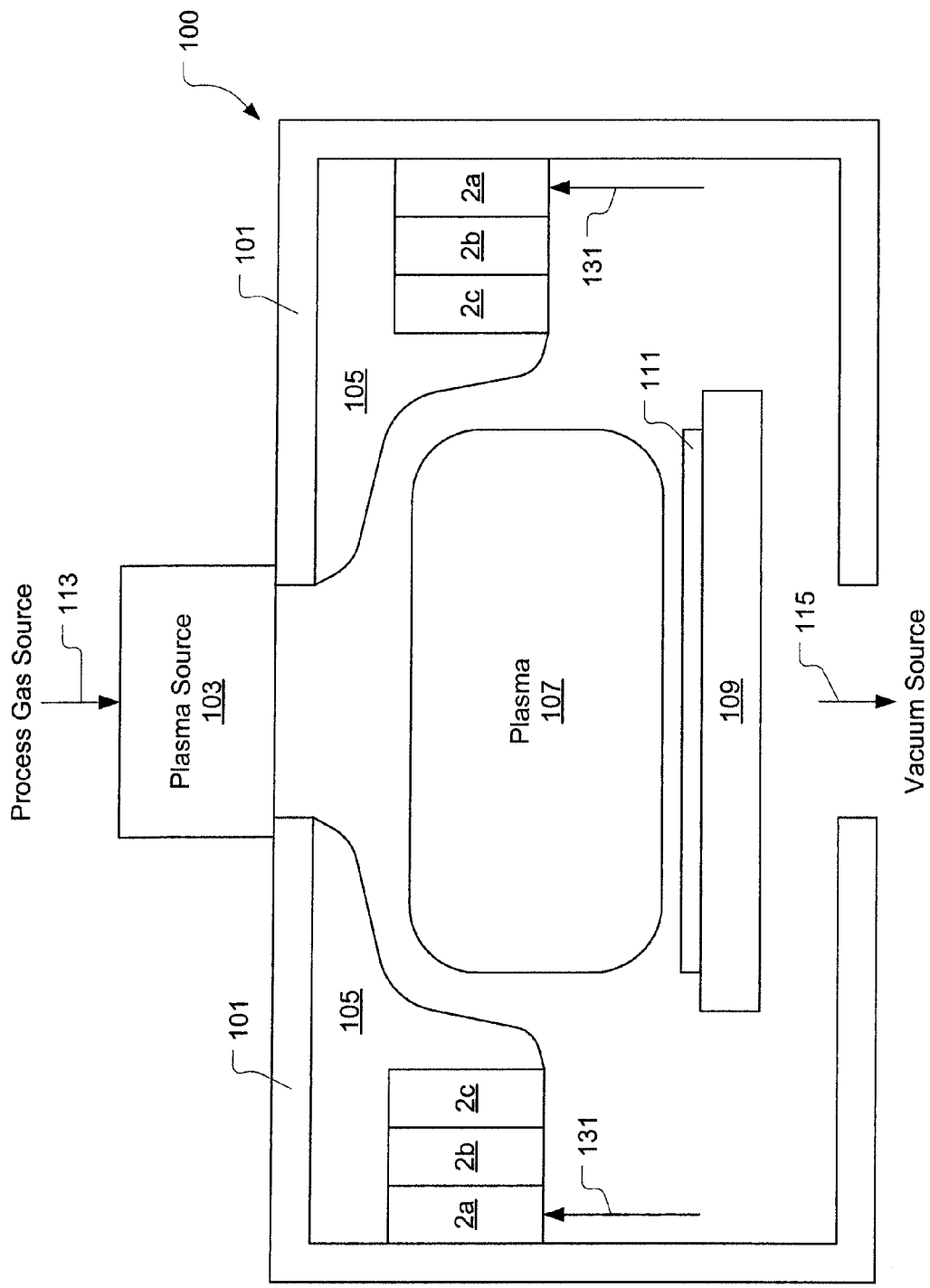

US 7,824,519 B2

VARIABLE VOLUME PLASMA PROCESSING CHAMBER AND ASSOCIATED METHODS

CROSS REFERENCE TO RELATED APPLICATIONS

This application is related to U.S. patent application Ser. No. 11/016,155, filed on Dec. 17, 2004, and entitled "Method and Apparatus for Plasma Diagnostics and the Measurement of Thin Films," the disclosure of which is incorporated in its entirety herein by reference.

BACKGROUND OF THE INVENTION

Semiconductor wafer ("wafer") fabrication often includes exposing a wafer to a plasma to allow the reactive constituents of the plasma to modify the surface of the wafer, e.g., remove or etch material from unprotected areas of the wafer surface. The wafer characteristics resulting from the plasma fabrication process are dependent on the process conditions, including the plasma density profile across the wafer surface. Additionally, because an amount of reaction between the plasma and a particular portion of the wafer surface is directly proportional to the plasma density over the particular portion of the wafer surface, variations in the plasma density profile can result in center-to-edge wafer uniformity problems. Such center-to-edge wafer uniformity problems can adversely affect a die yield per wafer.

Objectives in wafer fabrication include optimizing a die yield per wafer and fabricating each wafer of a common type in as identical a manner as possible. To meet these objectives, it is desirable to control the plasma density profile across the wafer and thereby control the etch uniformity across the wafer. Previous plasma processing techniques have attempted to establish a process window for a particular plasma chamber configuration that will yield an acceptable etch uniformity across the wafer. Such a process window is traditionally defined by parameters such as a pressure range, a gas flow range, a wafer temperature range, and a power level range. Experience indicates that a given process window is limited by the physical hardware configuration of the plasma chamber. Therefore, a plasma etching operation that falls outside of the process window achievable with a given plasma chamber may require the use of an alternate plasma chamber having a different physical hardware configuration and correspondingly different process window.

Procurement and maintenance of multiple plasma chambers having different physical hardware configurations in an effort to increase an overall plasma process window capability can be prohibitively expensive. Therefore, a solution is sought to expand the process window capability of a given plasma chamber.

SUMMARY OF THE INVENTION

In one embodiment, a plasma processing chamber is disclosed. The chamber includes a substrate support having a top surface defined to support a substrate in a substantially horizontal orientation within the chamber. The chamber also includes a number of telescopic members disposed within the chamber outside a periphery of the substrate support. The telescopic members are also disposed to be concentric with a center of the top surface of the substrate support. Each of the telescopic members is defined to be independently moved in a substantially vertical direction so as to enable adjustment of an open volume above the top surface of the substrate support.

In another embodiment, a plasma processing system is disclosed. The system includes a chamber having a substrate support defined to support a substrate in a substantially horizontal orientation within the chamber. The chamber also includes a number of telescopic members disposed within the chamber outside a periphery of the substrate support. Each of the number of telescopic members is defined to be independently moved in a substantially vertical direction so as to enable modification of an open volume above the substrate support. The system also includes metrology defined to monitor a condition of a plasma to be generated within the open volume above the substrate support. The metrology is also defined to generate signals indicative of the plasma condition. The system further includes a control system defined to direct movement of the number of telescopic members, in accordance with the signals to be generated by the metrology, so as to maintain a target plasma condition within the open volume.

In another embodiment, a method is disclosed for substrate plasma processing. The method includes an operation for placing a substrate on a substrate support within a chamber. The method also includes an operation for positioning a number of telescopic members, disposed within the chamber outside a periphery of the substrate support, so as to establish a prescribed open volume above the substrate support. The method further includes an operation for exposing the substrate to a plasma within the open volume above the substrate support.

Other aspects and advantages of the invention will become more apparent from the following detailed description, taken in conjunction with the accompanying drawings, illustrating by way of example the present invention.

BRIEF DESCRIPTION OF THE DRAWINGS

FIGS. 1E-1G are illustrations showing an upward sequence of telescopic member movement in the chamber of FIG. 1A, in accordance with one embodiment of the present invention;

DETAILED DESCRIPTION

In the following description, numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1A:
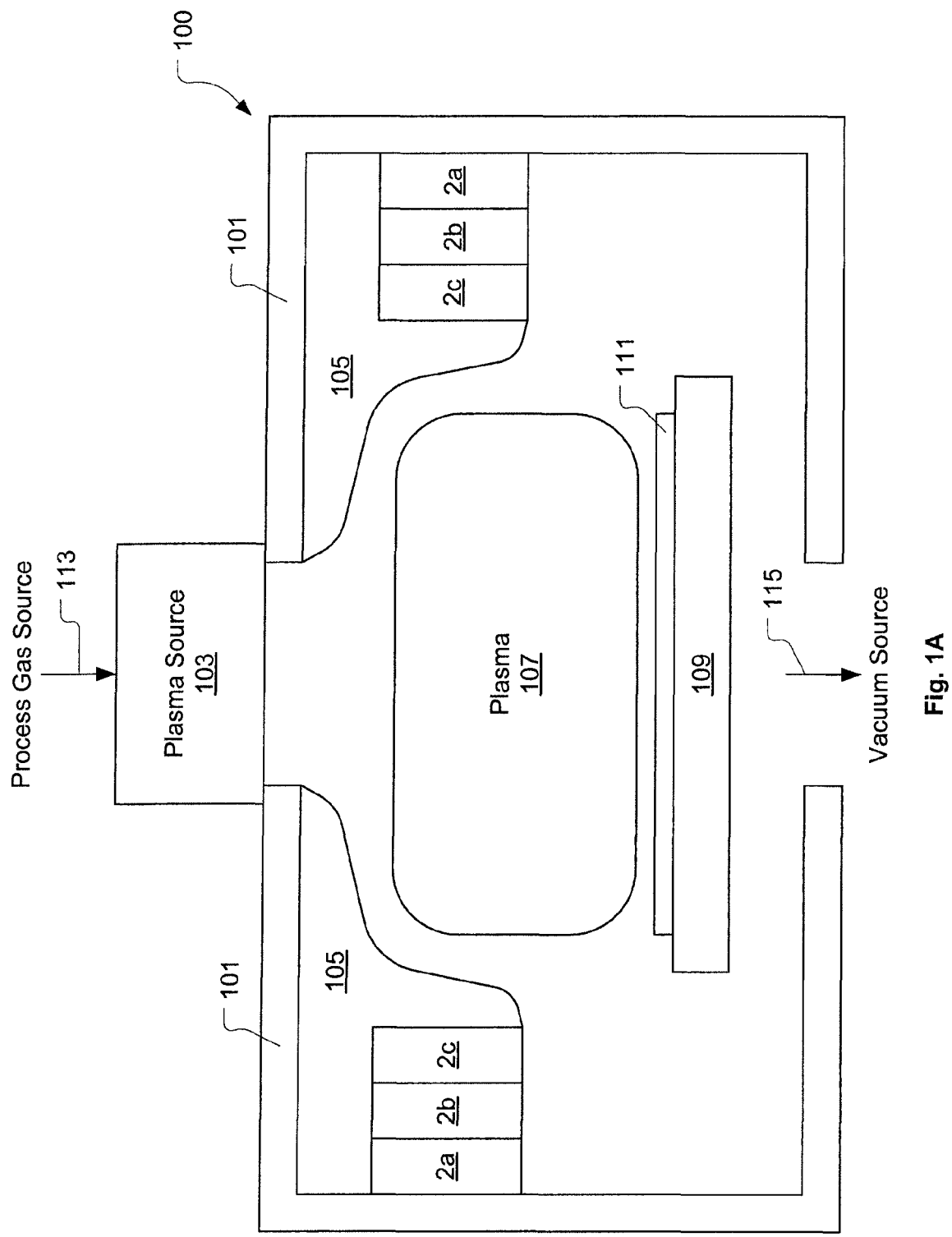
FIG. 1A is an illustration showing a vertical cross-section through a center of a plasma processing chamber, in accordance with one embodiment of the present invention.

FIG. 1A is an illustration showing a vertical cross-section through a center of a plasma processing chamber 100 ("chamber" hereafter), in accordance with one embodiment of the present invention. It should be understood that the chamber 100 is defined to have substantial radial symmetry. The chamber 100 is defined by surrounding walls 101, which include side walls, a top wall, and a bottom wall. A plasma source 103 is fluidly connected to an opening in the top of the chamber 100. The plasma source 103 is also fluidly connected to a process gas source, as indicated by arrow 113. The plasma source 103 functions to transform the process gas into chemical species that are in turn supplied to the chamber 100 so as to establish a plasma 107 within the chamber 100. The chamber is further defined to be fluidly connected to a vacuum source, as indicated by arrow 115, to enable discharge of the process gas from the chamber 100. In most cases, the plasma source 103 creates a majority of the chemical species of the plasma 107 used for etching a substrate 111, e.g., a semiconductor wafer.

The chamber 100 also includes a top liner 105 having a contoured inner surface defined to optimize a flow of the plasma 107 from the plasma source 103 into the chamber 100. Also, in one embodiment, the top liner 105 is defined to be heated. It should be understood that the shape of top liner 105 as depicted in FIG. 1A is provided by way of example. In other embodiments, the top liner 105 can assume essentially any shape necessary to facilitate the plasma process within the chamber 100.

The chamber 100 further includes a substrate support 109 having a top surface defined to support the substrate 111 in a substantially horizontal orientation within the chamber 100. The substrate support 109 is defined to be stationary within the chamber 100. In one embodiment, the substrate support 109 is defined as a pedestal incorporating a mechanical substrate clamping mechanism. In another embodiment, the substrate support 109 is defined as an electrostatic chuck (ESC) incorporating an electrostatic substrate clamping mechanism.

Additionally, in one embodiment, the substrate support 109 is defined as a radiofrequency (RF) powered electrode. The RF powered substrate support 109 generates a bias voltage to provide directionality to charged constituents within the plasma 107, such that the charged constituents are attracted downward toward the substrate support 109. The bias voltage generated by the RF powered substrate support 109 can benefit some plasma processes, such as ion assisted anisotropic etching of the substrate 111. In one embodiment, the RF powered substrate support 109 generates most of the charged species within the plasma 107, while the other reactive species in the plasma, e.g., free radicals, are generated primarily by the plasma source 103. Additionally, with the RF powered substrate support 109, the plasma 107 is capacitively coupled to the substrate support 109, thereby enabling the RF powered substrate support 109 to generate additional plasma 107 at the substrate 111 level.

Furthermore, in one embodiment, the substrate support 109 can be temperature controlled. For example, in one embodiment the temperature of the substrate support 109 can be controlled such that a temperature of the substrate 111 present thereon is maintained at a prescribed temperature within a range extending from about −150° C. to about 100° C.

The chamber 100 further includes a number of telescopic members 2a, 2b, 2c. The telescopic members 2a, 2b, 2c are disposed within the chamber 100 outside a periphery of the substrate support 109. More specifically, an innermost one of the telescopic members 2c is disposed to circumscribe the substrate support 109 at a radial position outside a periphery of the substrate support 109. Also, the outermost telescopic member 2a is disposed to be adjacent to the side wall of the chamber 100. Furthermore, the telescopic members 2a, 2b, 2c are disposed within the chamber 100 to be concentric with a center of the top surface of the substrate support 109. Although the exemplary embodiment depicted in FIG. 1A shows three telescopic members 2a, 2b, 2c, it should be appreciated that other embodiments can utilize essentially any number of telescopic members.

In one embodiment, the telescopic members 2a, 2b, 2c are defined as concentric cylinders. However, it should be understood that the telescopic members 2a, 2b, 2c can be defined by other geometric shapes, so long as the telescopic members 2a, 2b, 2c are concentrically disposed with regard to the center of the top surface of the substrate support 109 and are disposed outside a periphery of the substrate support 109.

Each of the telescopic members 2a, 2b, 2c is defined to be independently moved in a substantially vertical direction so as to enable adjustment of an open volume above the top surface of the substrate support 109 within the chamber 100. It should be appreciated that adjustment of the open volume above the top surface of the substrate support 109 corresponds to an adjustment of the volume available for the plasma 107 within the chamber 100. Additionally, depending on the electrical conductivity and connectivity of the telescopic members 2a, 2b, 2c, their vertical position within the chamber 100 can influence the RF return paths available for RF power emanating from the substrate support 109.

As described further below, the mechanical adjustment of the chamber physical configuration caused by vertical adjustment of the telescopic members 2a, 2b, 2c affects the plasma 107 distribution across the substrate 111. Therefore, the vertical position of the telescopic members 2a, 2b, 2c can be used to tune the plasma 107 uniformity across the substrate 111, and correspondingly tune the etch uniformity across the substrate 111. Also, because the vertical position of the telescopic members 2a, 2b, 2c can be adjusted either prior to or during a plasma process, the plasma 107 uniformity across the substrate 111 can be correspondingly adjusted either prior to or during a plasma process.

In the embodiment of FIG. 1A, a home position of the telescopic members 2a, 2b, 2c is defined within an upper region of the chamber 100. In one embodiment, each of the telescopic members 2a, 2b, 2c should be in the home position to enable transfer of the substrate 111 in and out of the chamber 100. Each of the telescopic members 2a, 2b, 2c is defined to be independently moved downward from the home position so as to enable adjustment of the open volume above the top surface of the substrate support 109, which is available to be occupied by the plasma 107.

Figure 1B:
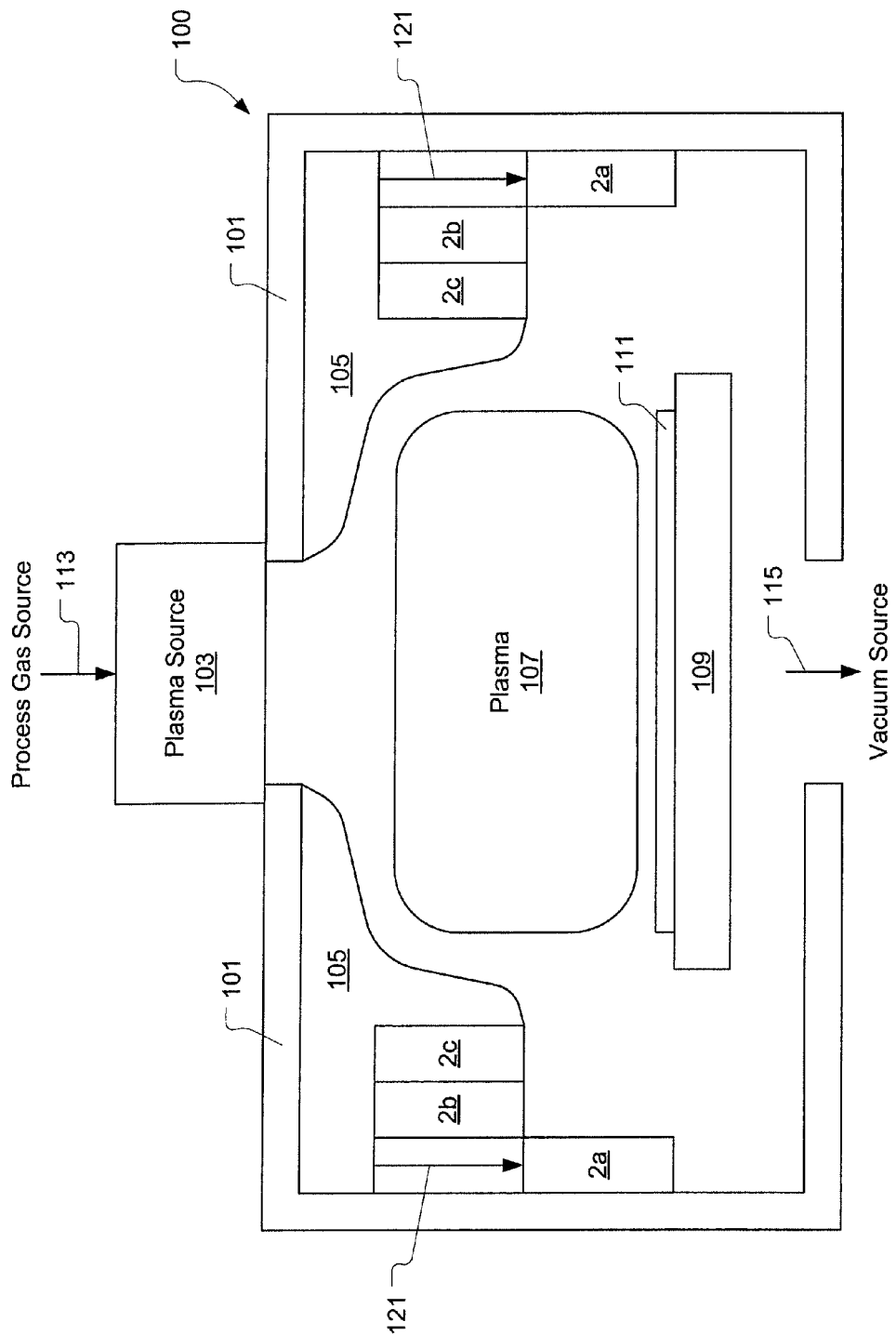
FIGS. 1B-1D are illustrations showing a downward sequence of telescopic member movement in the chamber of FIG. 1A, in accordance with one embodiment of the present invention.
Figure 1C:
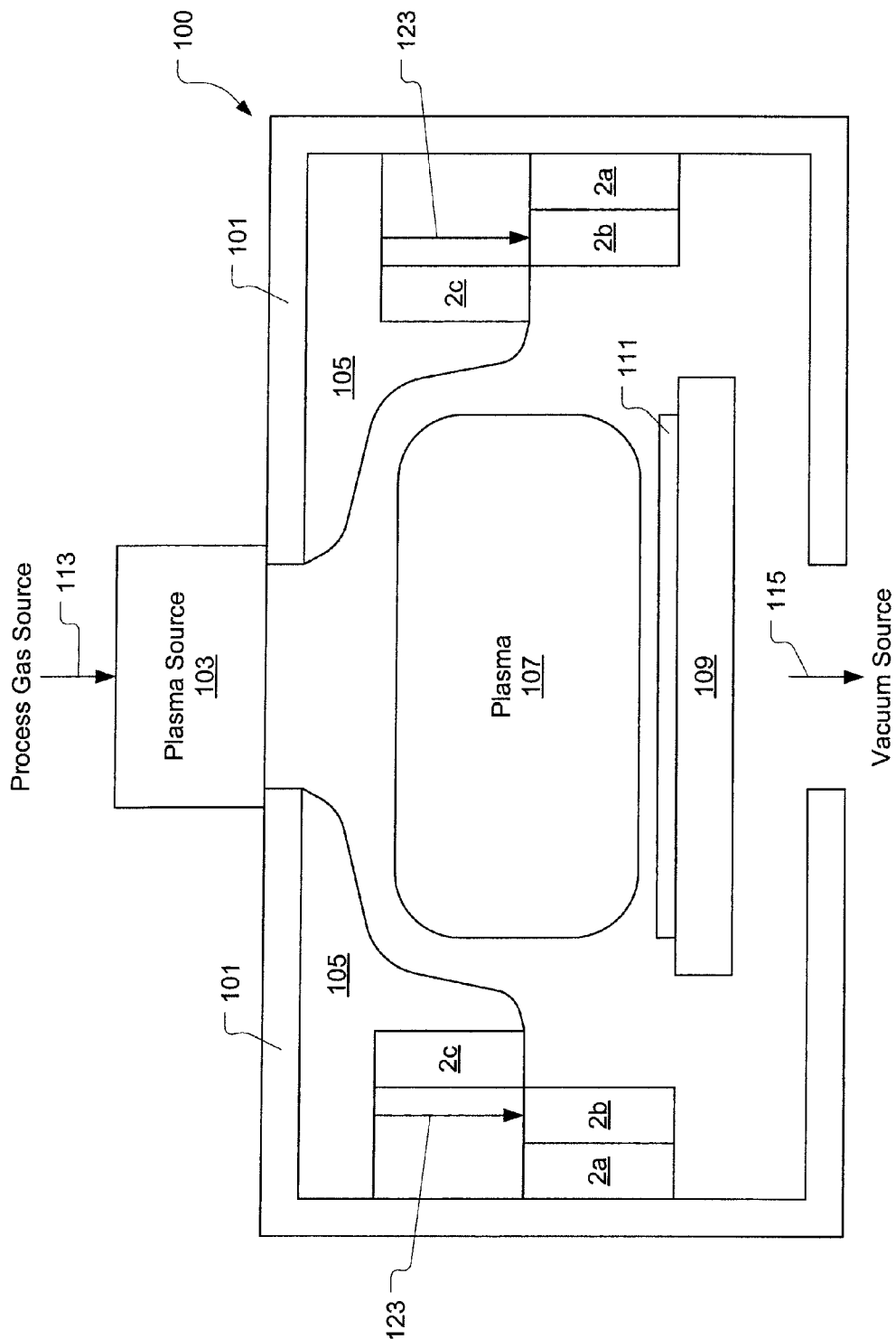
Figure 1D:
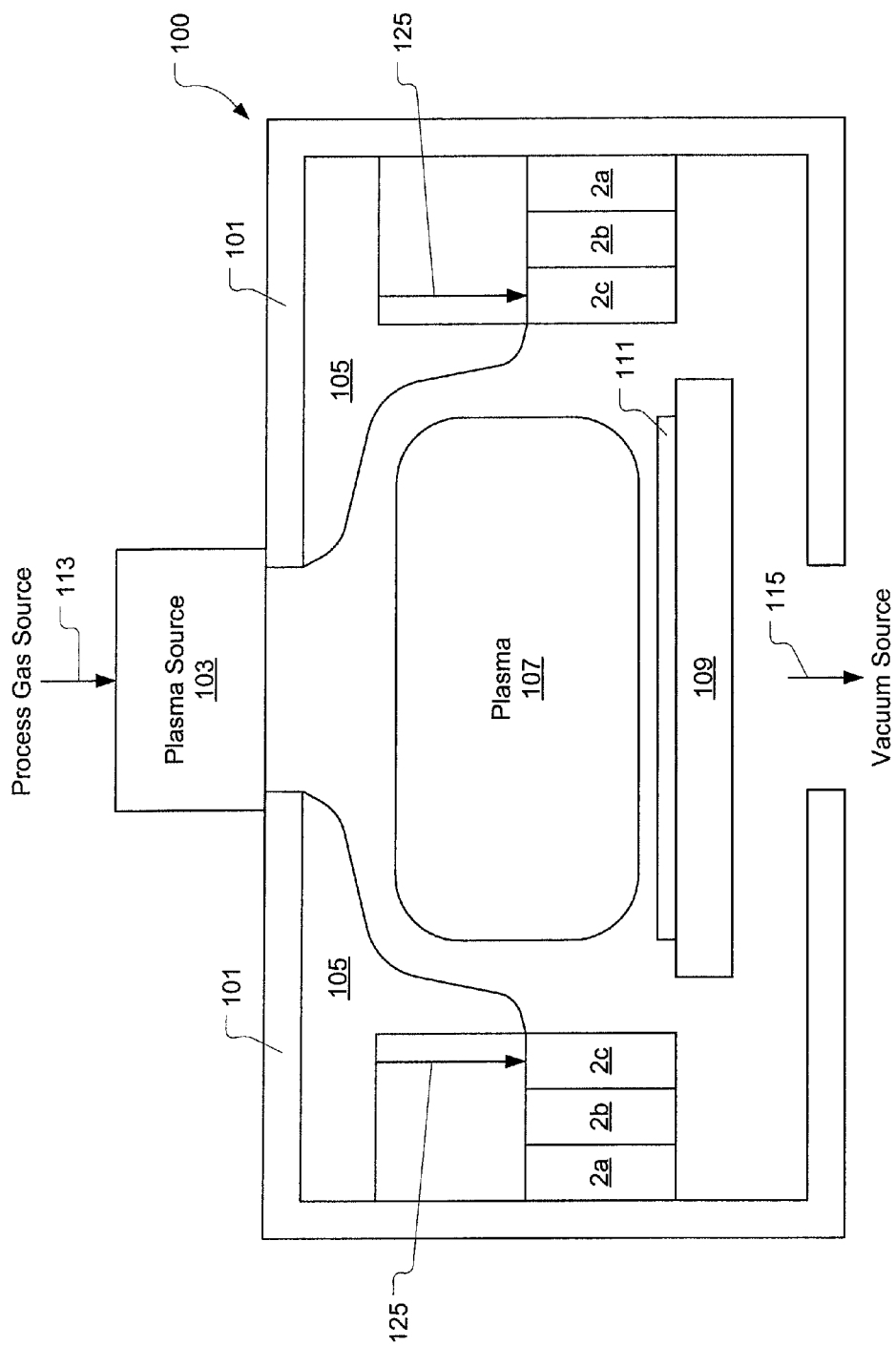

The telescopic members 2a, 2b, 2c are defined to be moved in a sequential telescoping manner so as to avoid formation of a plasma pocket outside either of the telescopic members 2a, 2b, 2c. To ensure that such plasma pockets are avoided, each of the telescopic members 2b, 2c, other than the outermost telescopic member 2a, is defined to have its movement from the home position limited to a position of its immediately surrounding telescopic member. For example, telescopic member 2b will have its vertical movement from the home position limited to the distance that telescopic member 2a has moved from the home position. Similarly, telescopic member 2c will have its vertical movement from the home position limited to the distance that telescopic member 2b has moved from the home position. The downward sequence of telescopic member 2a, 2b, 2c movement is from outside-to-inside. This downward sequence of telescopic member movement 2a, 2b, 2c, is depicted in FIGS. 1B through 1D. The upward sequence of telescopic member 2a, 2b, 2c movement is from inside-to-outside. This upward sequence of telescopic member movement 2a, 2b, 2c, is depicted in FIGS. 1E through 1G.

FIG. 1B is an illustration showing the chamber 100 with telescopic member 2a moved downward from the home position, as indicated by arrow 121. It should be appreciated that while the telescopic member 2a is shown as being moved to its full downward extent, each of the telescopic members 2a, 2b, 2c can be moved a distance less than its full downward extent. For example, in one embodiment, a stepper motor is used to move each of the telescopic members 2a, 2b, 2c. The stepper motor can be controlled such that each telescopic member 2a, 2b, 2c can be at any vertical position between its home position and its full downward extent, so long as plasma pockets are avoided outside either of the telescopic members 2a, 2b, 2c. The stroke distance provided by the stepper motor represents one variable in determining the preciseness with which the open volume above the top surface of the substrate support 109 can be controlled. Also, the amount and rate of vertical position adjustment of the telescopic members 2a, 2b, 2c represent process dependent parameters.

FIG. 1C is an illustration showing the chamber 100 with telescopic member 2b moved downward from the home position, as indicated by arrow 123. FIG. 1D is an illustration showing the chamber 100 with telescopic member 2c moved downward from the home position, as indicated by arrow 125. Again, it should be appreciated that telescopic members 2a, 2b, 2c are moved downward in an outside-to-inside sequence.

Figure 1E:
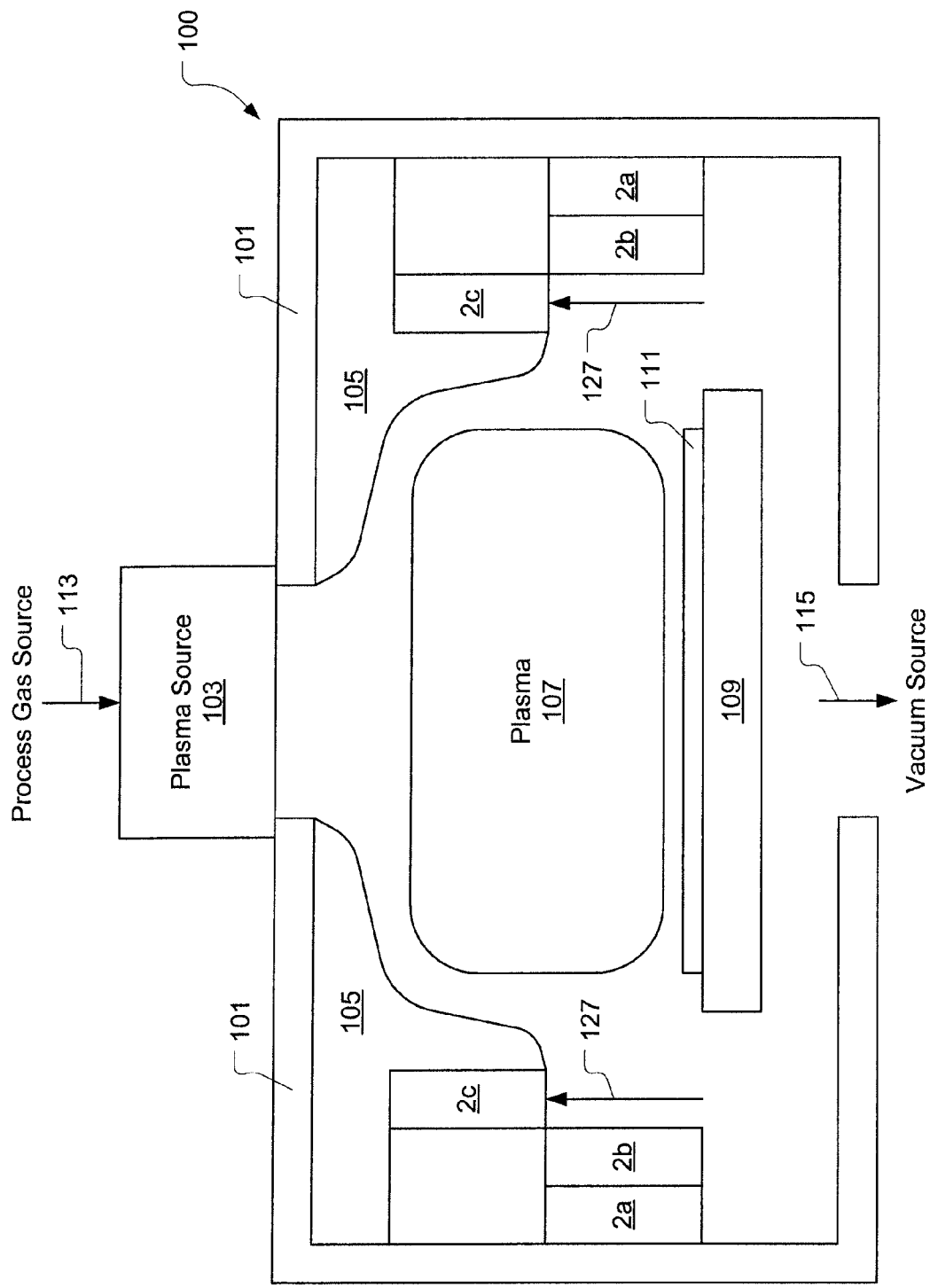
Figure 1F:
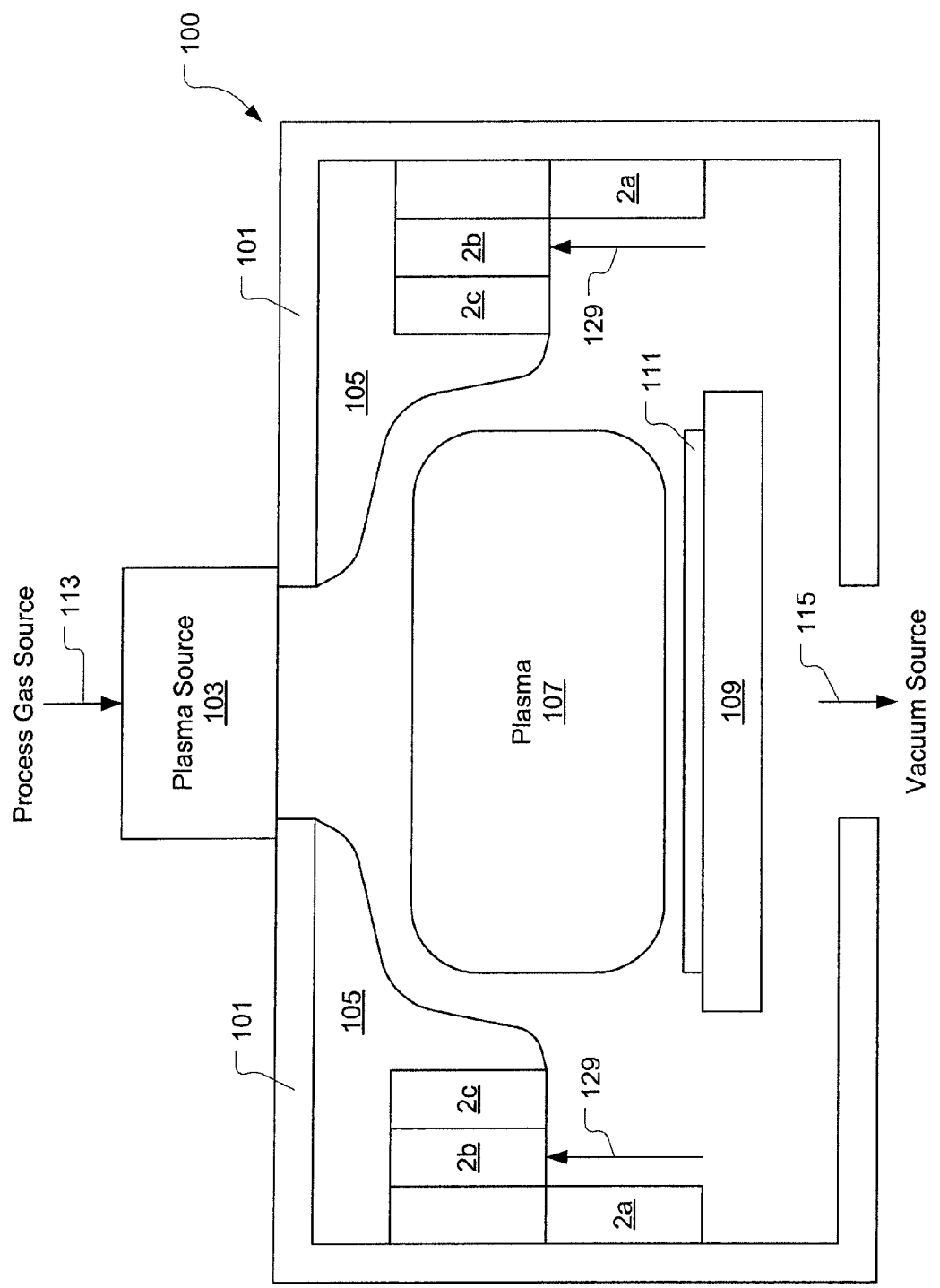

FIG. 1E is an illustration showing the chamber 100 with telescopic member 2c moved upward back to the home position, as indicated by arrow 127. FIG. 1F is an illustration showing the chamber 100 with telescopic member 2b moved upward back to the home position, as indicated by arrow 129. FIG. 1G is an illustration showing the chamber 100 with telescopic member 2a moved upward back to the home position, as indicated by arrow 131. Again, it should be appreciated that telescopic members 2a, 2b, 2c are moved upward in an inside-to-outside sequence.

Figure 2:
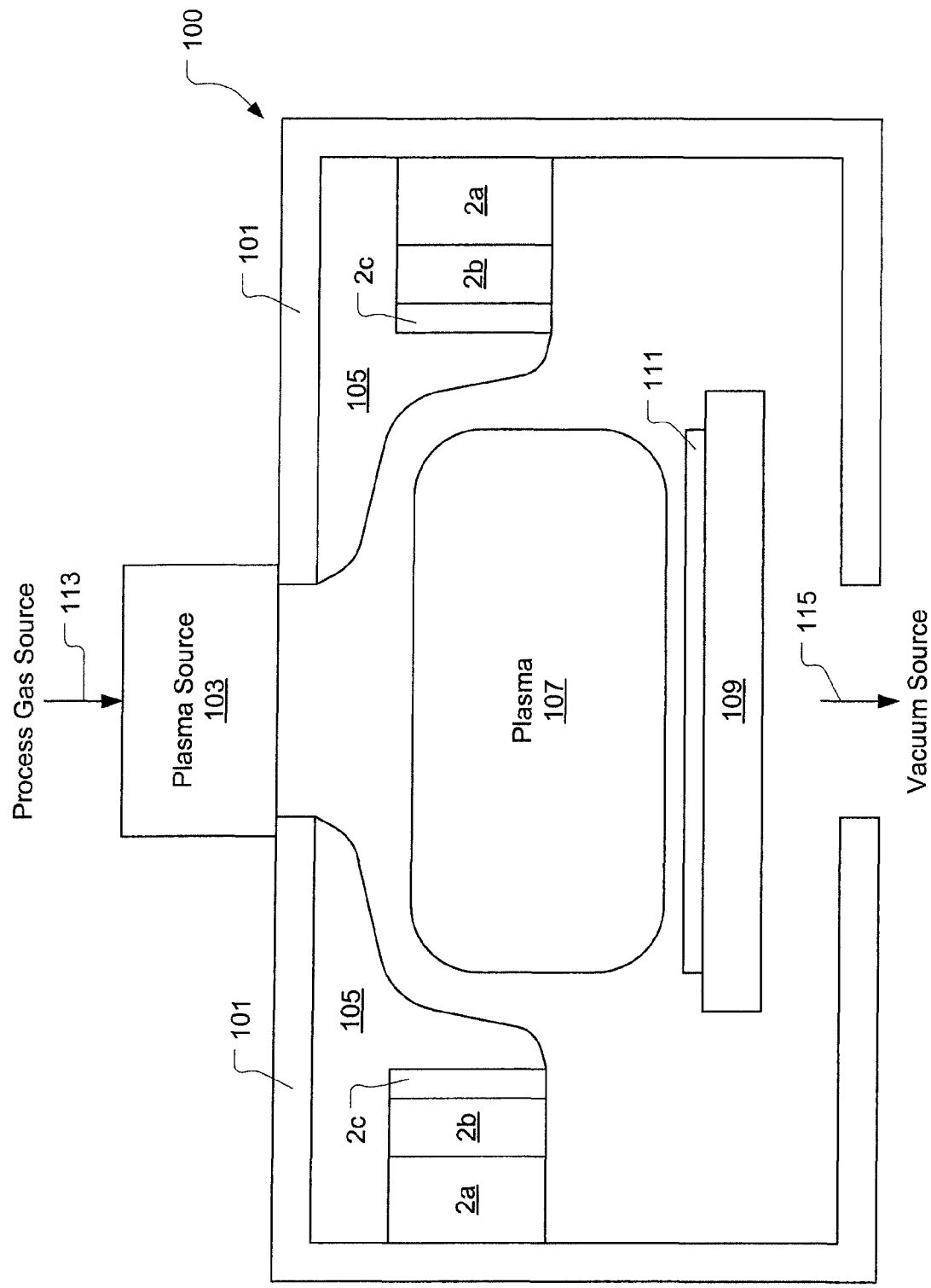
FIG. 2 is an illustration showing telescopic members of varying radial thickness, in accordance with one embodiment of the present invention.

Although the telescopic members 2a, 2b, 2c are depicted in FIGS. 1A through 1G as having a substantially similar radial thickness, in other embodiments the radial thickness of each telescopic member 2a, 2b, 2c can vary. FIG. 2 is an illustration showing the chamber 100 incorporating telescopic members 2a, 2b, 2c of varying radial thickness, in accordance with one embodiment of the present invention. In the embodiment of FIG. 2, each of the telescopic members 2a, 2b, 2c is defined to have a different radial thickness such that the radial thickness of the telescopic members 2a, 2b, 2c increases with increased radial position relative to the substrate support 109. In another embodiment, the various telescopic members are defined to have essentially the same volume, thereby requiring their radial thickness to vary. Also, it should be appreciated that different telescopic member thickness provides finer control over adjustments in the open volume overlying the top surface of the substrate support 109. For example, provision of a inner telescopic member of thinner radial thickness provides for finer control over adjustment of the open volume available for the plasma 107.

In one embodiment, each of the telescopic members 2a, 2b, 2c is formed from an electrically conductive material and is electrically connected to a ground potential. For example, in various embodiments the telescopic members 2a, 2b, 2c can be formed from a metal, such as aluminum, anodized aluminum, coated aluminum, among others. It should be appreciated, however, that in other embodiments the telescopic members 2a, 2b, 2c can be formed from essentially any metal that is compatible with the plasma processing environment present within the chamber 100.

The electrically conductive telescopic members 2a, 2b, 2c can provide an RF return path for the RF power emanating from the substrate support 109. Therefore, the vertical position of the telescopic members 2a, 2b, 2c, i.e., the proximity of the telescopic members 2a, 2b, 2c to the substrate support 109, will influence the directionality of the RF power transmitted through the chamber 100 from the RF powered substrate support 109.

When all of the telescopic members 2a, 2b, 2c are in the home position, the plasma 107 volume at the substrate 111 level is the greatest, and the distance between the substrate support 109 and the grounded side wall of the chamber 100 is the greatest. Therefore, when the telescopic members 2a, 2b, 2c are in the home position, the RF return path to the grounded side wall of the chamber 100 is the longest. Consequently, the RF coupling between the substrate support 109 and the side wall of the chamber 100 is the least significant.

When the outer telescopic member 2a lowers, the distance between the substrate support 109 and the ground potential is effectively reduced, thereby increasing the RF coupling at the periphery of the substrate support 109, which correspondingly increases the plasma 107 density at the periphery of the substrate support 109. As the middle and the inner telescopic members 2b and 2c, respectively, are lowered, the RF coupling at the periphery of the substrate support 109 becomes more and more intense. Therefore, the plasma 107 uniformity across the substrate support 109 (and substrate 111) changes as the vertical positions of the telescopic members 2a, 2b, 2c are adjusted, i.e., as the proximity of each grounded telescopic member 2a, 2b, 2c to the substrate support 109 is adjusted. Since a higher plasma density usually corresponds to a higher etch rate on the substrate 111, the telescopic members 2a, 2b, 2c provide an effective way to tune the etch uniformity across the substrate 111. In other words, grounded telescopic members 2a, 2b, 2c can be used to correct an "edge slow" problem found in some plasma etch applications.

In another embodiment, each of the telescopic members 2a, 2b, 2c is formed from a dielectric material, i.e., electrically insulating material. For example, in various embodiments the telescopic members 2a, 2b, 2c can be formed from a dielectric material such as aluminum oxide, aluminum nitride, or silicon oxide (quartz), among others. It should be appreciated, however, that in other embodiments the telescopic members 2a, 2b, 2c can be formed from essentially any dielectric material that is compatible with the plasma processing environment present within the chamber 100.

In contrast to the electrically conductive telescopic members 2a, 2b, 2c previously discussed, the dielectric telescopic members 2a, 2b, 2c block RF coupling between the substrate support 109 and the grounded side wall of the chamber 100. When the RF coupling between the substrate support 109 and the grounded side wall of the chamber 100 is blocked or reduced, the plasma density is decreased at the periphery of the substrate support 109. Therefore, as the dielectric telescopic members 2a, 2b, 2c are lowered, the thickness of dielectric material between the substrate support 109 and the side wall of the chamber 100 increases, the intensity of RF coupling between the substrate support 109 and the side wall of the chamber 100 decreases, and the plasma density at the periphery of the substrate support 109 decreases. It should be appreciated that because the dielectric telescopic members 2a, 2b, 2c can serve to reduce the plasma density at the periphery of the substrate support 109, the dielectric telescopic members 2a, 2b, 2c can be used to correct an "edge fast" problem found in some plasma etch applications.

In another embodiment, each of the telescopic members 2a, 2b, 2c can be formed from either an electrically conductive material or a dielectric material, such that the telescopic members 2a, 2b, 2c together represent a combination of electrically conductive and dielectric telescopic members. For example, in one embodiment, the inner telescopic member 2c can be formed from a dielectric material with the other outer telescopic members 2a and 2b formed from an electrically conductive material. In this embodiment, the electrically conductive (and grounded) outer telescopic members 2a and 2b can be moved from their home position to a position proximate to the periphery of the substrate support 109. Also, in this embodiment, the inner dielectric telescopic member 2c can be moved a portion of the distance from its home position to its fully extended position. Thus, in this embodiment, the outer electrically conductive telescopic members 2a and 2b are moved to increase the RF coupling at the periphery of the substrate support 109, while the inner dielectric member 2c is moved a limited distance to influence the volume available for plasma above substrate support 109, without blocking the RF coupling at the periphery of the substrate support 109. It should be appreciated that the above-described embodiment is provided by way of example. In other embodiments, the telescopic members 2a, 2b, 2c can be defined as different combinations of dielectric and electrically conductive materials, and may be positioned in any number of ways to cause a particular effect on the plasma volume and RF coupling for a given process chemistry and recipe.

Surface recombination causes the ionized gas molecules and radicals within the plasma 107 to be neutralized at each surface within the chamber 100 regardless of whether the material at the surface is electrically conductive or dielectric. Therefore, surface recombination causes the plasma 107 to be extinguished at each surface within the chamber. Consequently, movement of the telescopic members 2a, 2b, 2c relative to the substrate support 109 affects the plasma 107 uniformity at the substrate 111 level. However, surface recombination is considered to be a second order effect on the plasma 107 density, with the RF coupling representing a first order effect. Therefore, for the electrically conductive and grounded telescopic members 2a, 2b, 2c, the surface recombination effect associated with the telescopic members 2a, 2b, 2c serves to temper the increase in plasma 107 density at the periphery of the substrate support 109 caused by the increase in RF coupling between the substrate support 109 and the telescopic members 2a, 2b, 2c. Conversely, for the dielectric telescopic members 2a, 2b, 2c, the surface recombination effect associated with the telescopic members 2a, 2b, 2c serves to intensify the decrease in plasma 107 density at the periphery of the substrate support 109 caused by the decrease in RF coupling between the substrate support 109 and the side wall of the chamber 100.

As discussed above, positioning of the telescopic members 2a, 2b, 2c enables adjustment of the open volume overlying the substrate support 109 and substrate 111 supported thereon. Also, positioning of the telescopic members 2a, 2b, 2c enables adjustment of the RF coupling at the periphery of the substrate support 109, thereby enabling adjustment of the plasma density at the periphery of both the substrate support 109 and substrate 11 supported thereon. Consequently, positioning of the telescopic members 2a, 2b, 2c can be used to tune etch uniformity across the substrate 111. By moving the telescopic members 2a, 2b, 2c up and down, it is possible to determine a position of the telescopic members 2a, 2b, 2c that provides the best etch uniformity across the substrate 111 for a process chemistry and recipe. Essentially, the telescopic members 2a, 2b, 2c should be positioned to find an optimum balance between the open volume overlying the substrate support 109 and the proximity of the RF powered substrate support 109 to a ground potential.

Figure 3:
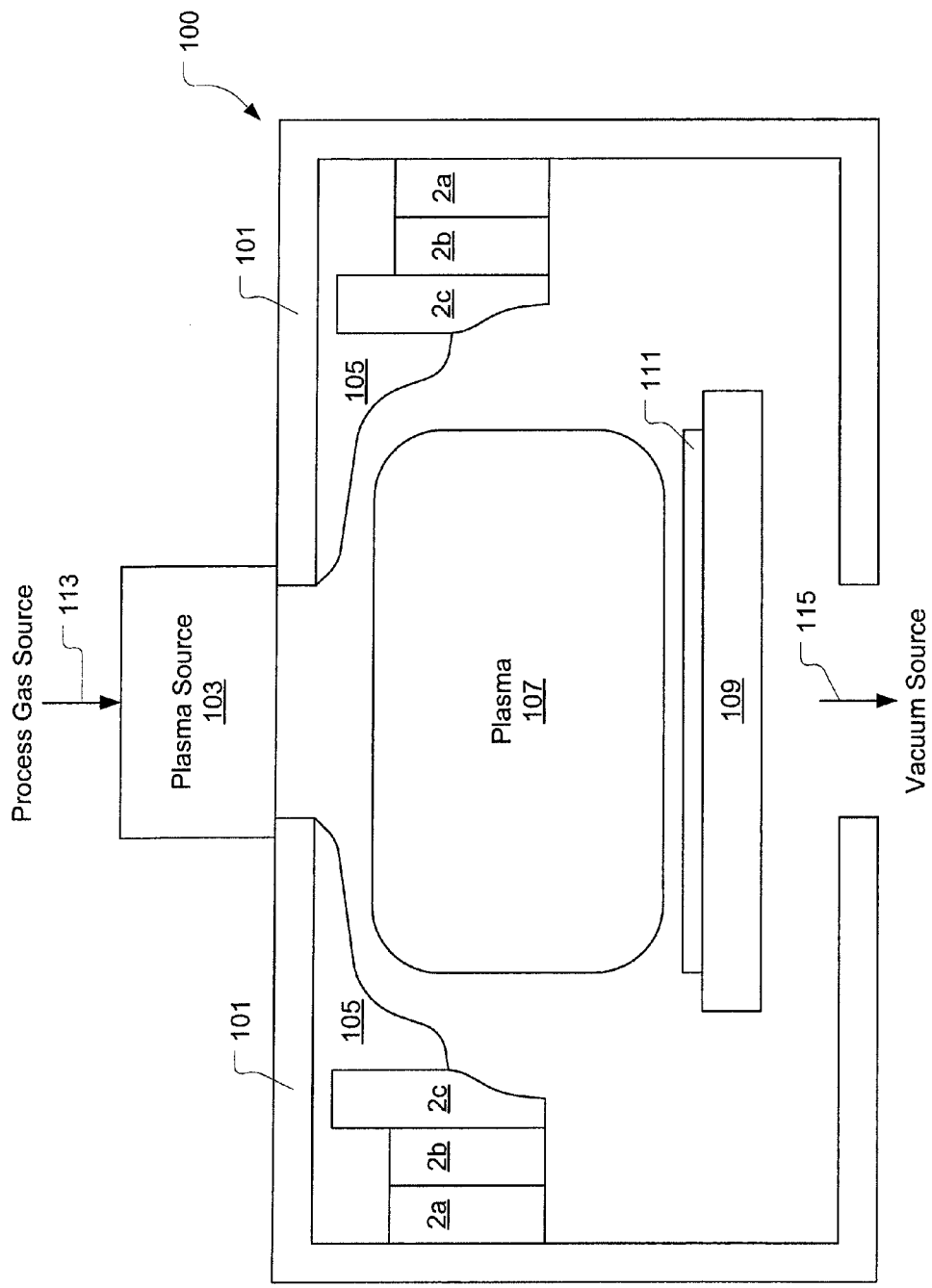
FIG. 3 is an illustration showing telescopic members of varying shape, in accordance with one embodiment of the present invention.

It should be understood that although the exemplary telescopic members 2a, 2b, 2c depicted in FIGS. 1A-1G and 2 are shown to be a concentric series of hollow right circular cylinders, in other embodiments the telescopic members 2a, 2b, 2c can be defined to have different shapes. FIG. 3 is an illustration showing the chamber 100 incorporating telescopic members 2a, 2b, 2c of varying shape, in accordance with one embodiment of the present invention. In the embodiment of FIG. 3, the telescopic member 2c having a radial position closest to the substrate support is defined to have a contoured inner surface profile. The contoured inner surface profile of telescopic member 2c can be defined to optimize the uniformity of RF power coupling with the substrate support 109 and/or optimize gas flow dynamics within the chamber. In other embodiments, the shape of each telescopic member 2a, 2b, 2c can be independently defined to optimize the plasma process. For example, the shape of each telescopic member 2a, 2b, 2c can be defined to streamline gas flow through the chamber 100 and/or optimize the uniformity of ion and radicals within the plasma 107. It should be appreciated that the shape of each telescopic member 2a, 2b, 2c can be defined in essentially any manner to accommodate process requirements.

Figure 4A:
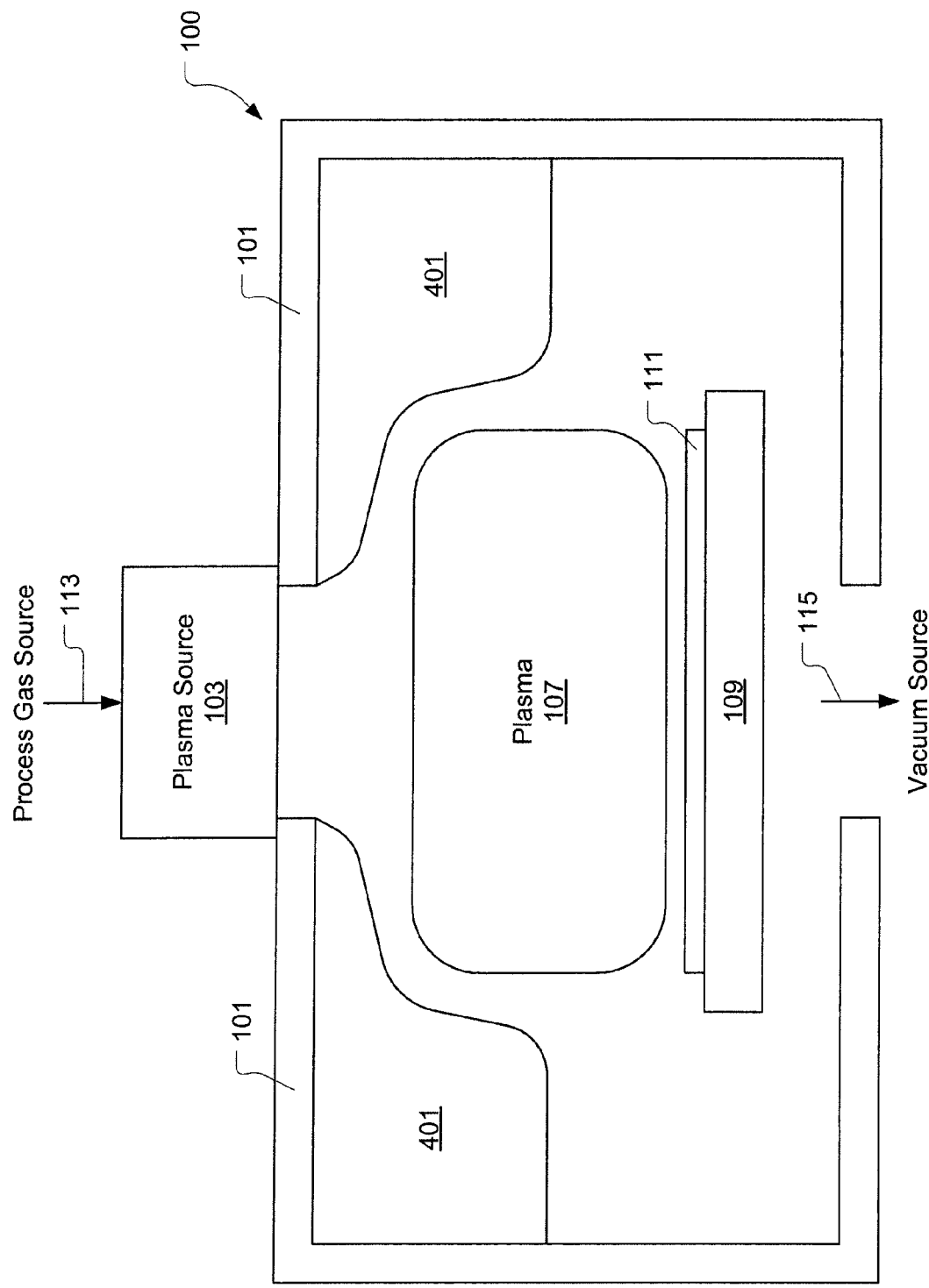
FIGS. 4A-4B are illustrations showing a chamber having a movable liner as opposed to telescopic members, in accordance with one embodiment of the present invention.
Figure 4B:
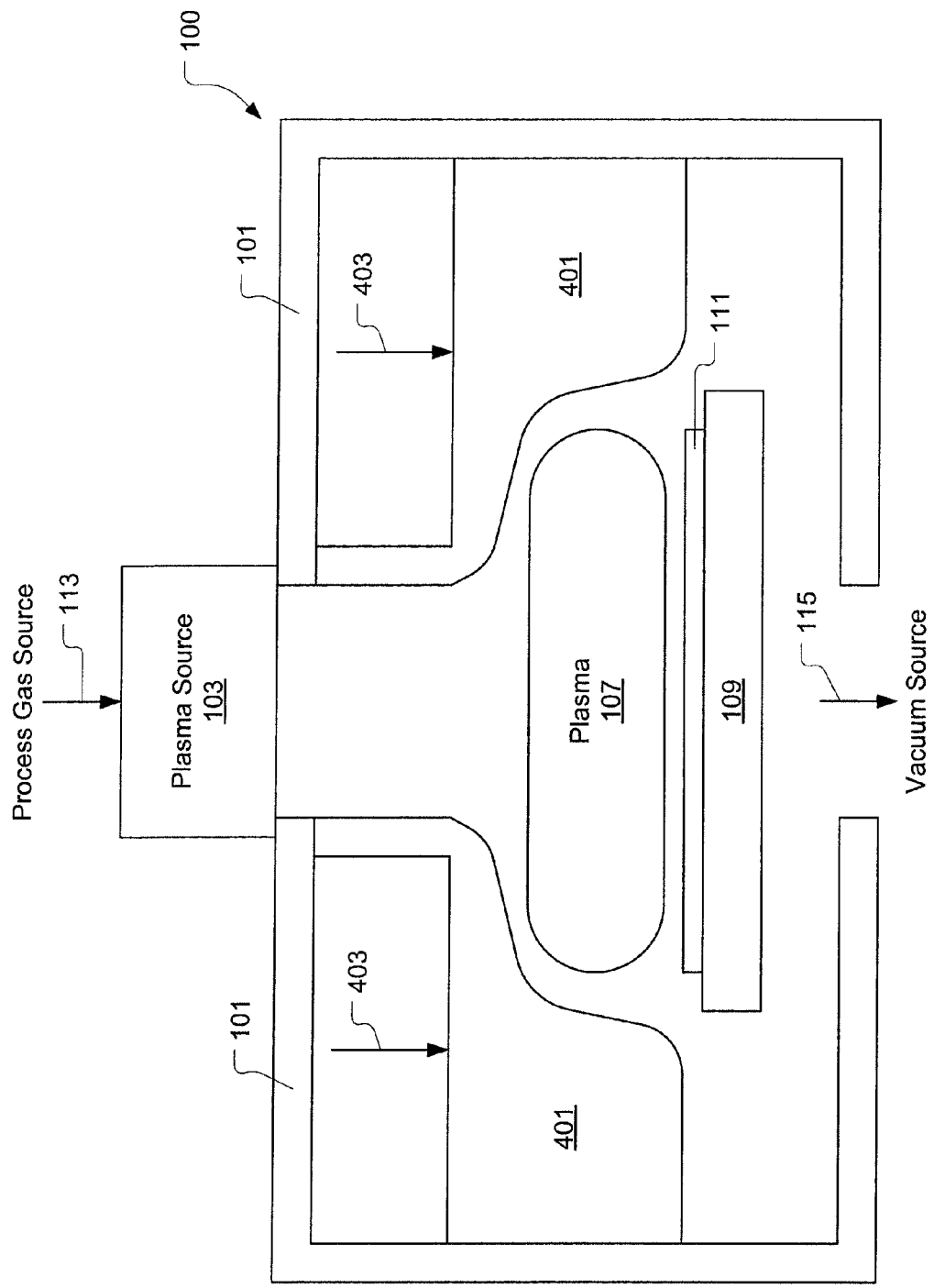

In the embodiments of FIGS. 1A-1G, 2, and 3, the home position of the telescopic members 2a, 2b, 2c is defined within the liner 105. FIG. 4A-4B are illustrations showing the chamber 100 having a movable liner 401 as opposed to telescopic members, in accordance with one embodiment of the present invention. The moveable liner 401 is defined to function in a manner similar to the telescopic members 2a, 2b, 2c, as previously discussed with regard to FIGS. 1A-1G, 2 and 3. In FIG. 4A, the moveable liner 401 is shown to be in its home position at the top of the chamber 100. In FIG. 4B, the moveable liner 401 is shown to be moved downward toward the substrate support 109, as indicated by arrows 403.

If the moveable liner 401 is formed from an electrically conductive material and is electrically connected to a ground potential, movement of the liner 401 toward the RF powered substrate support 109 will serve to increase the RF coupling at the periphery of the substrate support 109, thereby increasing the plasma density at the periphery of the substrate support 109. However, if the moveable liner 401 is formed from a dielectric material, movement of the liner 401 toward the RF powered substrate support 109 will serve to decrease the RF coupling at the periphery of the substrate support 109, thereby decreasing the plasma density at the periphery of the substrate support 109.

Figure 5A:
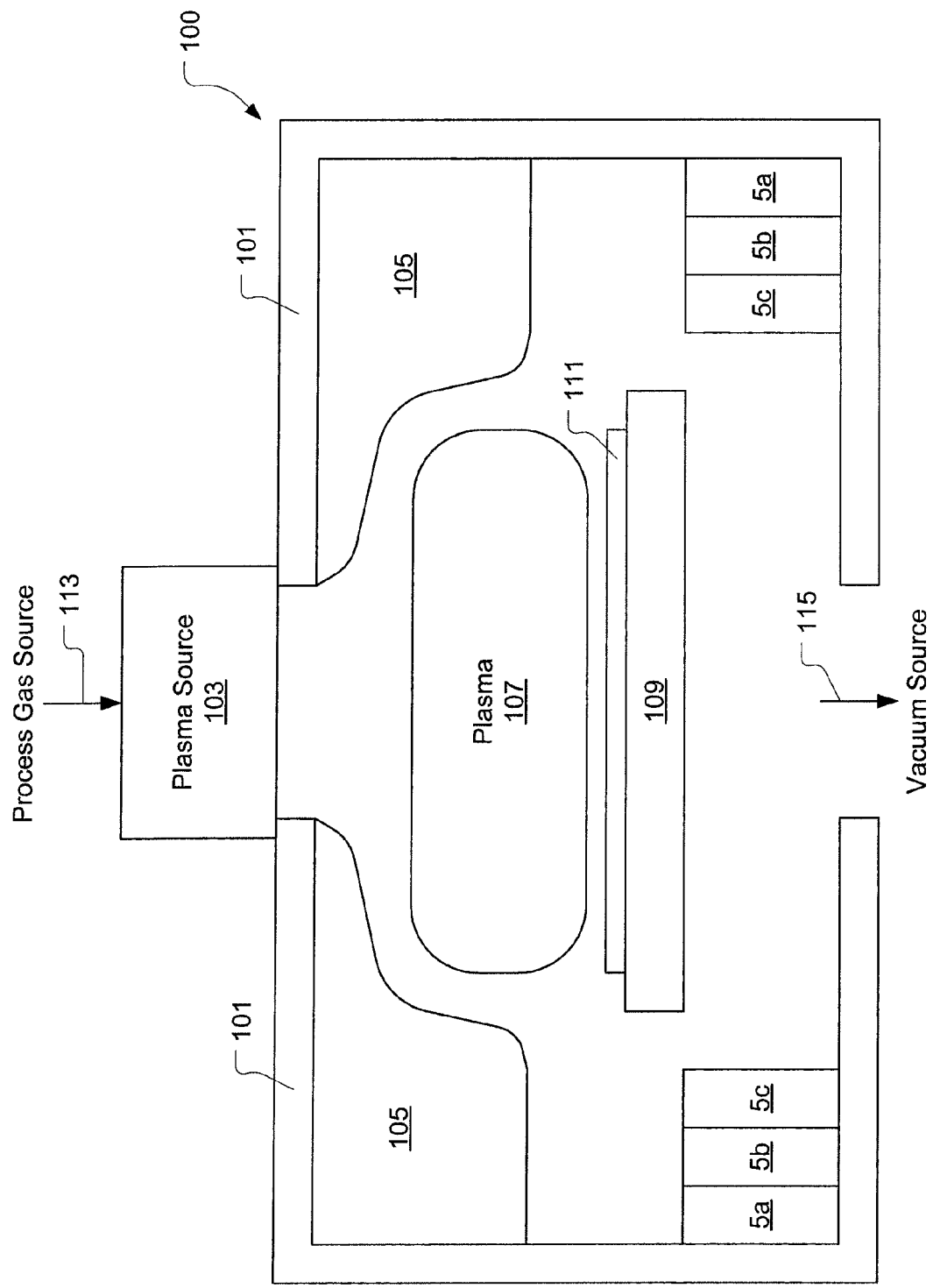
FIG. 5A is an illustration showing a chamber including telescopic members having a home position defined within a region of the chamber below the top surface of the substrate support, in accordance with one embodiment of the present invention.

FIG. 5A is an illustration showing the chamber 100 including telescopic members 5a, 5b, 5c having a home position defined within a region of the chamber 100 below the top surface of the substrate support 109, in accordance with one embodiment of the present invention. In the embodiment of FIG. 5A, each of the telescopic members 5a, 5b, 5c is defined to be independently moved upward from the home position, so as to enable adjustment of the open volume above the top surface of the substrate support 109. It should be understood that the telescopic members 5a, 5b, 5c posses the same features and functions as the telescopic members 2a, 2b, 2c previously discussed with regard to the embodiments of FIGS. 1A-1G, 2, and 3.

Figure 5B:
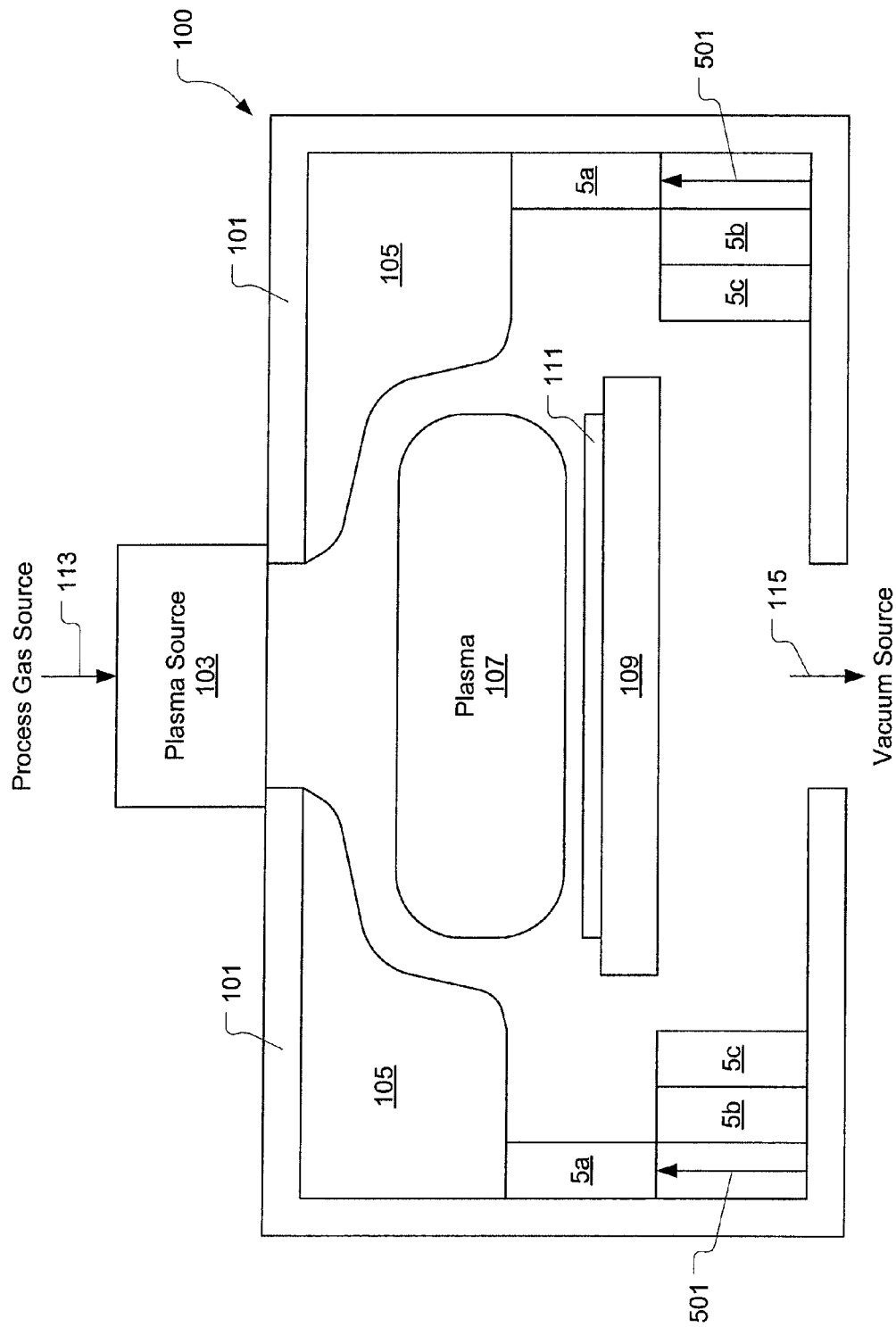
FIGS. 5B-5D are illustrations showing an upward sequence of telescopic member movement in the chamber of FIG. 5A, in accordance with one embodiment of the present invention.
Figure 5C:
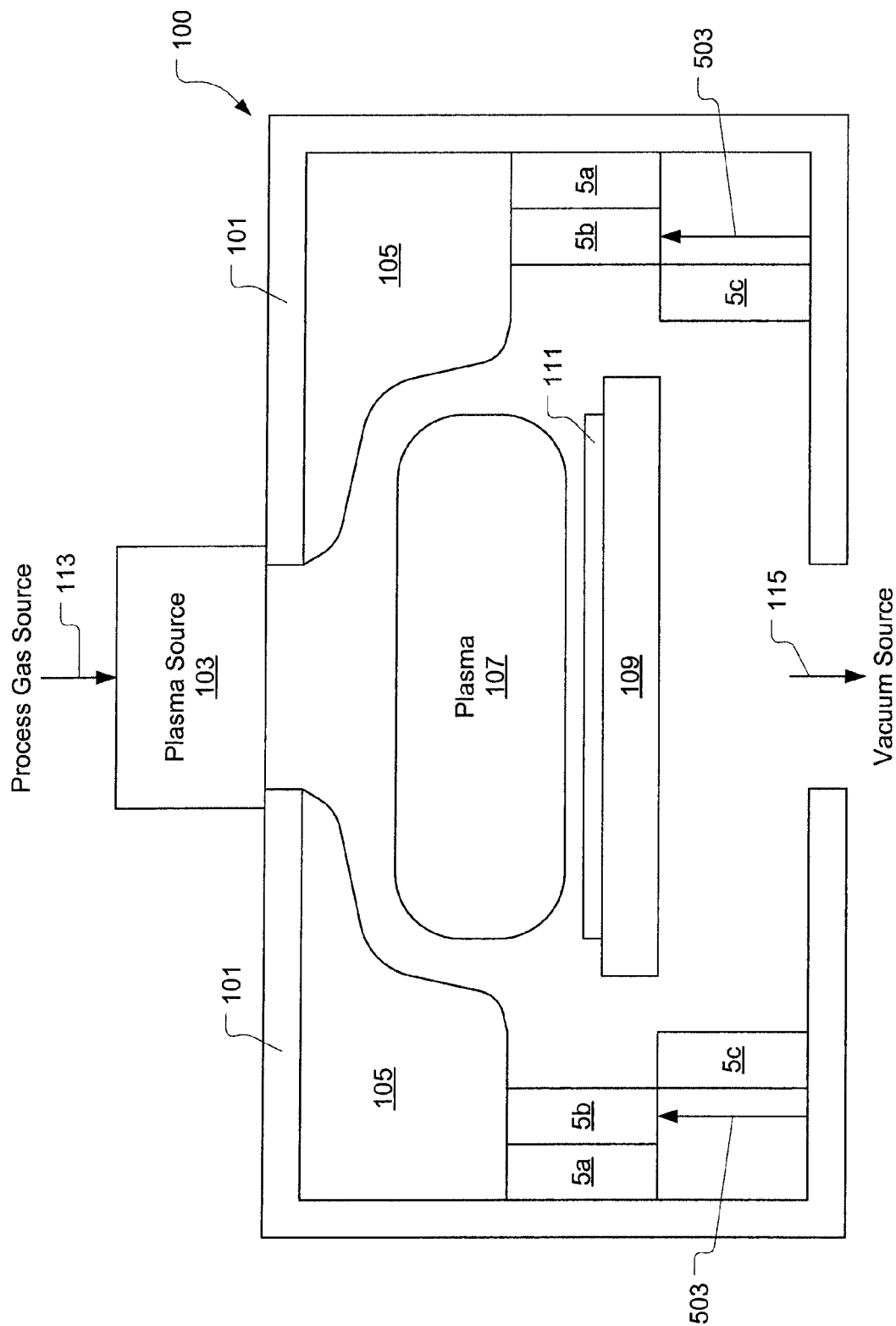
Figure 5D:
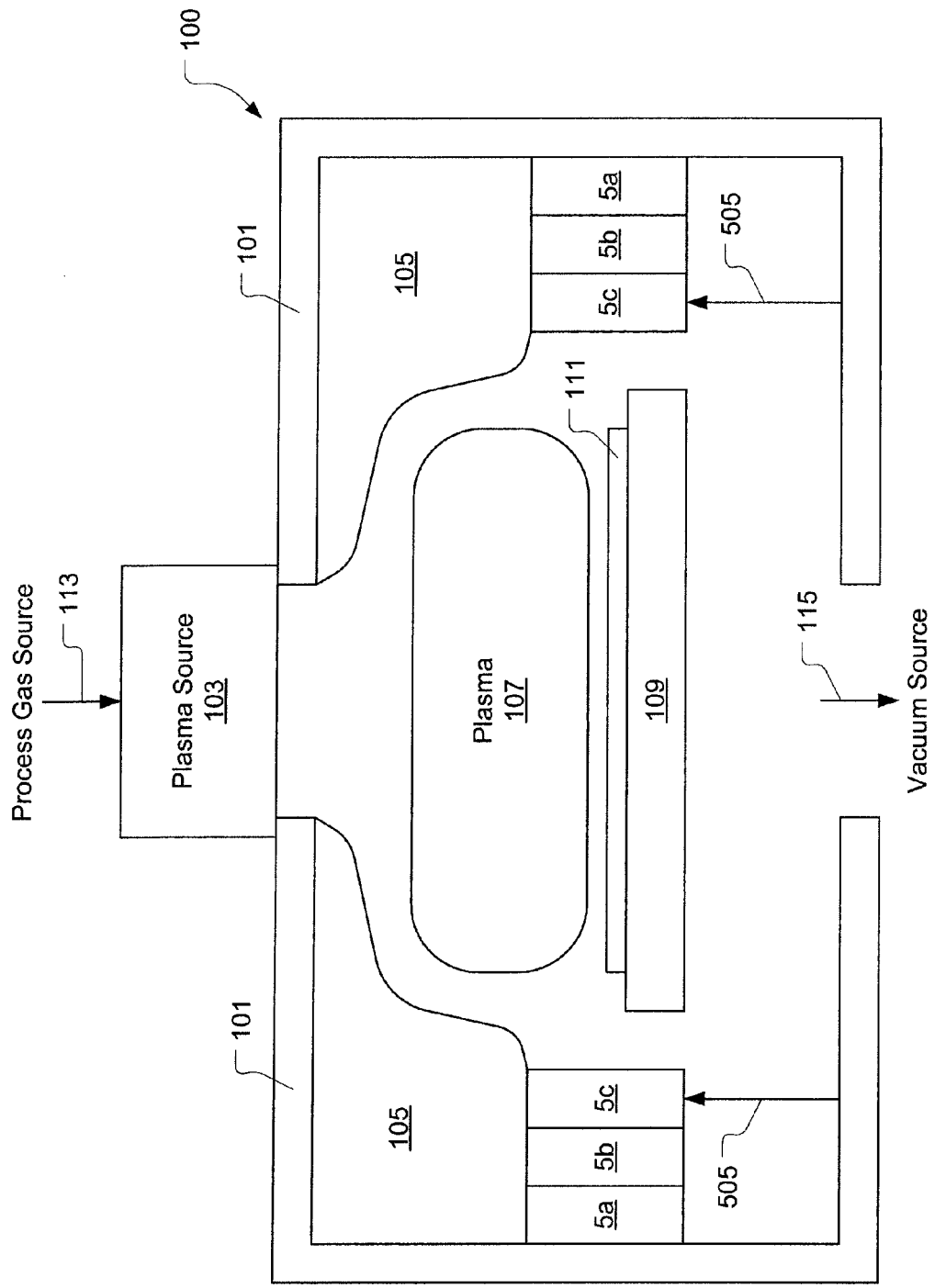

The telescopic members 5a, 5b, 5c are defined to be moved in a sequential telescoping manner so as to avoid formation of a plasma pocket outside either of the telescopic members 5a, 5b, 5c. To ensure that such plasma pockets are avoided, each of the telescopic members 5b, 5c, other than the outermost telescopic member 5a, is defined to have its movement from the home position limited to a position of its immediately surrounding telescopic member. For example, telescopic member 5b will have its vertical movement from the home position limited to the distance that telescopic member 5a has moved from the home position. Similarly, telescopic member 5c will have its vertical movement from the home position limited to the distance that telescopic member 5b has moved from the home position. The upward sequence of telescopic member 5a, 5b, 5c movement is from outside-to-inside. This upward sequence of telescopic member 5a, 5b, 5c movement, is depicted in FIGS. 5B through 5D. The downward sequence of telescopic member 5a, 5b, 5c movement is from inside-to-outside. This downward sequence of telescopic member 5a, 5b, 5c movement, is depicted in FIGS. 5E through 5G.

FIG. 5B is an illustration showing the chamber 100 with telescopic member 5a moved upward from the home position, as indicated by arrows 501. It should be appreciated that while the telescopic member 5a is shown as being moved to its full upward extent, each of the telescopic members 5a, 5b, 5c can be moved a distance less than its full upward extent. For example, in one embodiment, a stepper motor is used to move each of the telescopic members 5a, 5b, 5c. The stepper motor can be controlled such that each telescopic member 5a, 5b, 5c can be at any vertical position between its home position and its full upward extent, so long as plasma pockets are avoided outside either of the telescopic members 5a, 5b, 5c. The stroke distance provided by the stepper motor represents one variable in determining the preciseness with which the open volume above the top surface of the substrate support 109 can be controlled. Also, the amount and rate of vertical position adjustment of the telescopic members 5a, 5b, 5c represent process dependent parameters.

FIG. 5C is an illustration showing the chamber 100 with telescopic member 5b moved upward from the home position, as indicated by arrows 503. FIG. 5D is an illustration showing the chamber 100 with telescopic member 5c moved upward from the home position, as indicated by arrows 505. Again, it should be appreciated that telescopic members 5a, 5b, 5c are moved upward in an outside-to-inside sequence.

Figure 5E:
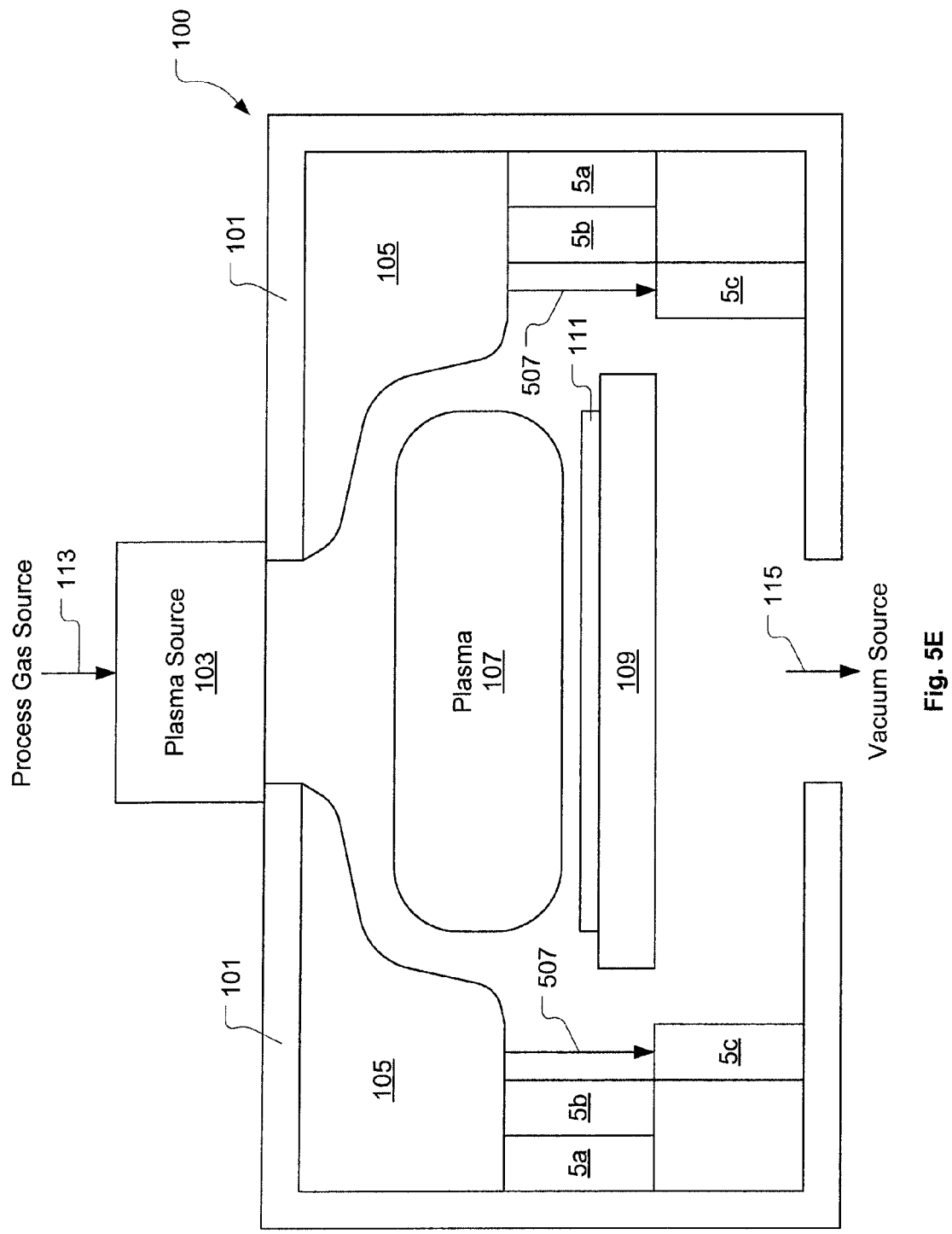
FIGS. 5E-5G are illustrations showing a downward sequence of telescopic member movement in the chamber of FIG. 5A, in accordance with one embodiment of the present invention.
Figure 5F:
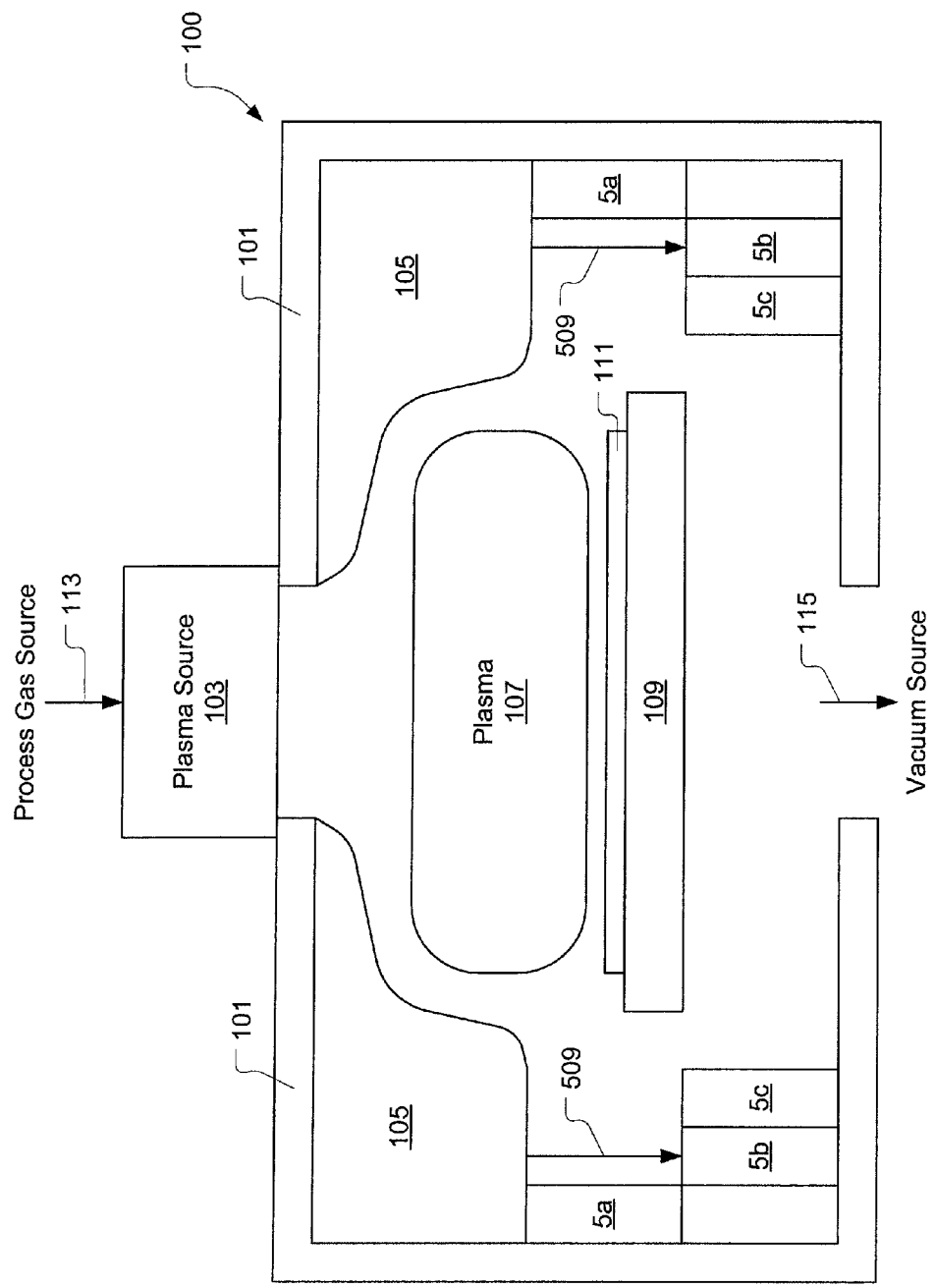
Figure 5G:
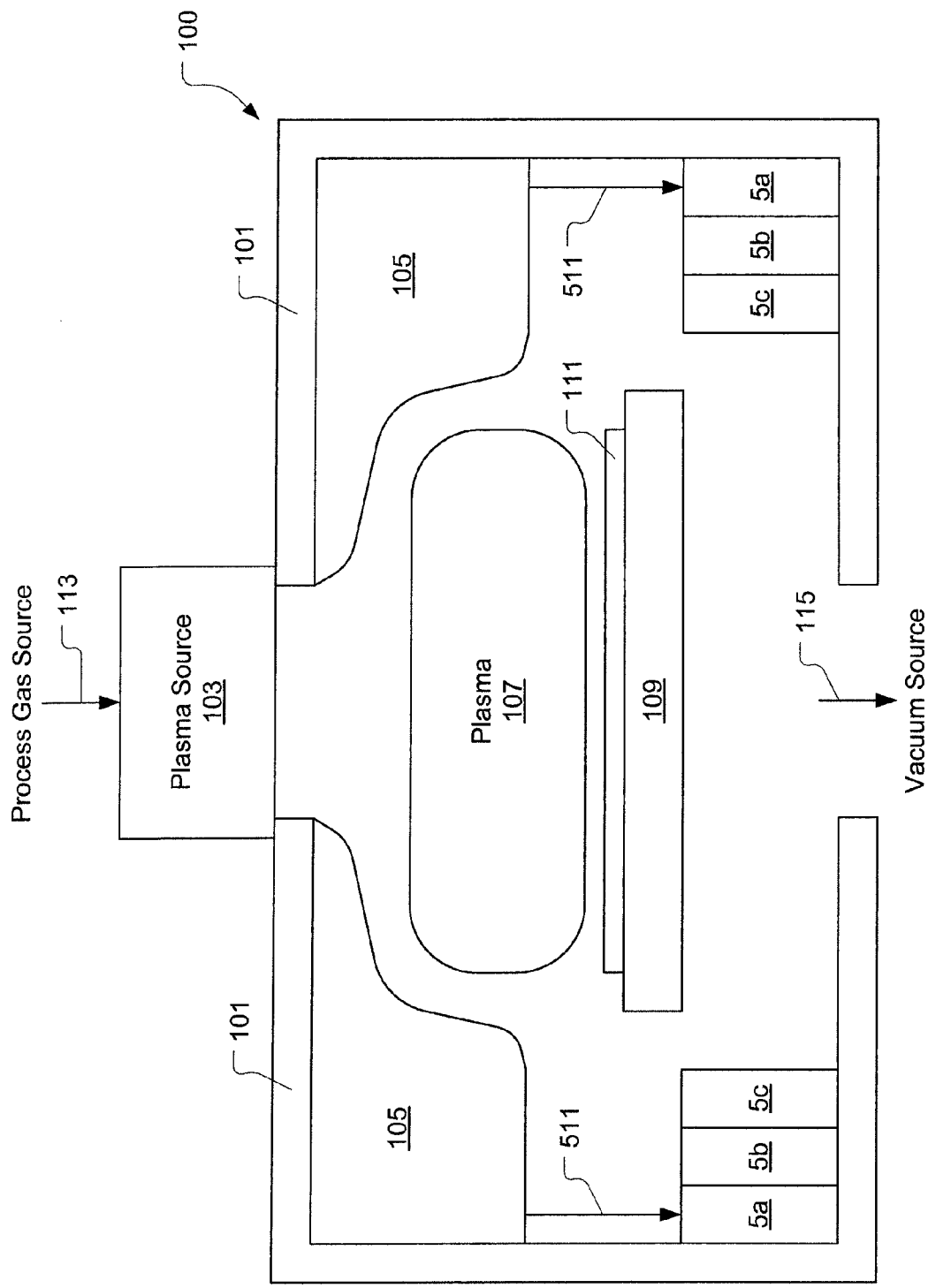

FIG. 5E is an illustration showing the chamber 100 with telescopic member 5c moved downward back to the home position, as indicated by arrows 507. FIG. 5F is an illustration showing the chamber 100 with telescopic member 5b moved downward back to the home position, as indicated by arrows 509. FIG. 5G is an illustration showing the chamber 100 with telescopic member 5a moved downward back to the home position, as indicated by arrows 511. Again, it should be appreciated that telescopic members 5a, 5b, 5c are moved downward in an inside-to-outside sequence.

In one embodiment, the telescopic members 2a, 2b, 2c, 5a, 5b, 5c are defined to be temperature controlled. Heating of the telescopic members 2a, 2b, 2c, 5a, 5b, 5c serves to reduce deposition of material thereon and may also serve to repel neutrals within the plasma 107. In one embodiment, the telescopic members 2a, 2b, 2c, 5a, 5b, 5c are defined to have their temperature controlled within a range extending from about −40° C. to about 300° C. It should be appreciated that the specific temperature at which the telescopic members 2a, 2b, 2c, 5a, 5b, 5c are maintained is established based on process requirements. Additionally, in one embodiment, one or more of the telescopic members 2a, 2b, 2c, 5a, 5b, 5c can be defined to include an embedded magnet to enhance plasma 107 shaping. For example, in one embodiment, the telescopic member may be defined as a permanent magnet encased within a material compatible with the plasma processing environment, such as silicon carbide, aluminum, or coated aluminum, among others.

It should be appreciated that the telescopic members, as described herein, provide an additional control capability with regard to etch uniformity across the substrate. By varying the position of the telescopic members relative to the substrate support, the open volume available for the plasma to occupy within the chamber and the RF return paths through the chamber can be manipulated in a controlled manner, with a corresponding effect on the plasma uniformity across the substrate. In one embodiment, the telescopic members can be set in a required position prior to performing a plasma process, and can be adjusted between plasma processes. In another embodiment, the position of the telescopic members can be adjusted during a plasma process.

Figure 6:
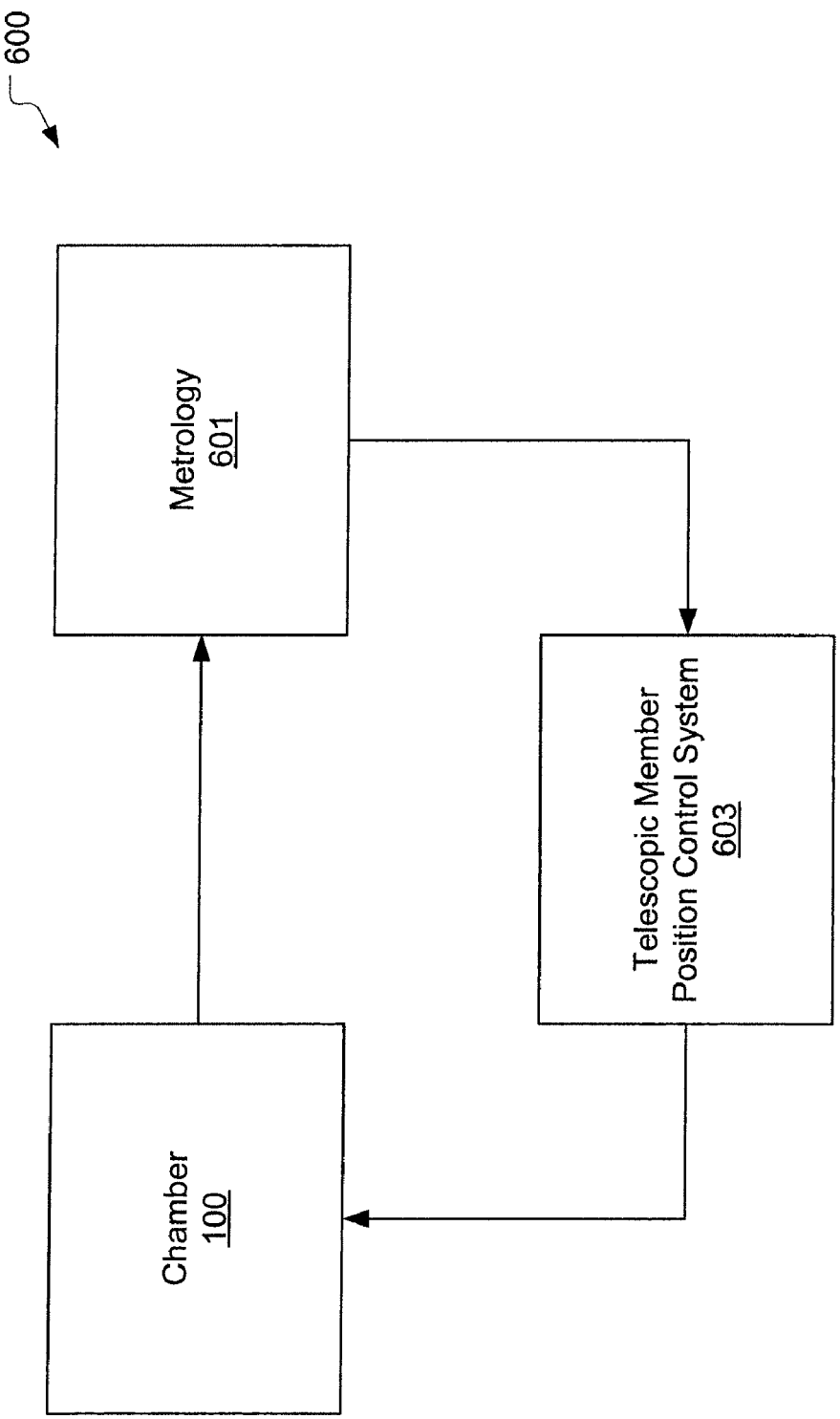
FIG. 6 is an illustration showing a plasma processing system defined to control the position of the telescopic members within the chamber in a dynamic manner depending on a condition of the plasma, in accordance with one embodiment of the present invention.

FIG. 6 is an illustration showing a plasma processing system 600 defined to control the position of the telescopic members within the chamber in a dynamic manner depending on a condition of the plasma, in accordance with one embodiment of the present invention. The system 600 includes the chamber 100 having the substrate support 109 defined to support the substrate 111 in a substantially horizontal orientation within the chamber 100. The chamber 100 also includes a number of telescopic members disposed within the chamber 100 outside a periphery of the substrate support 109. In various embodiments, the telescopic members may correspond to the telescopic members 2a, 2b, 2c having the upper home position, the telescopic members 5a, 5b, 5c having the lower home position, or the moveable liner 401. Regardless of the particular embodiment, each of the telescopic members is defined to be independently moved in a substantially vertical direction so as to enable modification of an open volume above the substrate support 109.

The system 600 also includes metrology 601 defined to monitor a condition of the plasma 107 within the open volume overlying the substrate support 109 and generate signals indicative of the plasma condition. Some techniques for monitoring a plasma condition are described in U.S. patent application Ser. No. 11/016,155, entitled "Method and Apparatus for Plasma Diagnostics and the Measurement of Thin Films," which is incorporated herein by reference. In one embodiment, the metrology 601 is defined to detect a particular response on the surface of the substrate 111. The particular substrate surface response may be indicated by a change in the optical emission spectrum of the plasma, a change in bias voltage at the substrate, a change in impedance of the overall RF circuit, or essentially any other signal indicative of a particular substrate surface response.

The system 600 further includes a control system 603 defined to direct movement of the telescopic members in accordance with the signals generated by the metrology 601, so as to maintain a target plasma condition within the open volume overlying the substrate support 109. Thus, the control system 603 is defined to direct movement of the telescopic members within the chamber in a dynamic manner based on a real-time condition of the plasma as monitored by the metrology 601.

Figure 7:
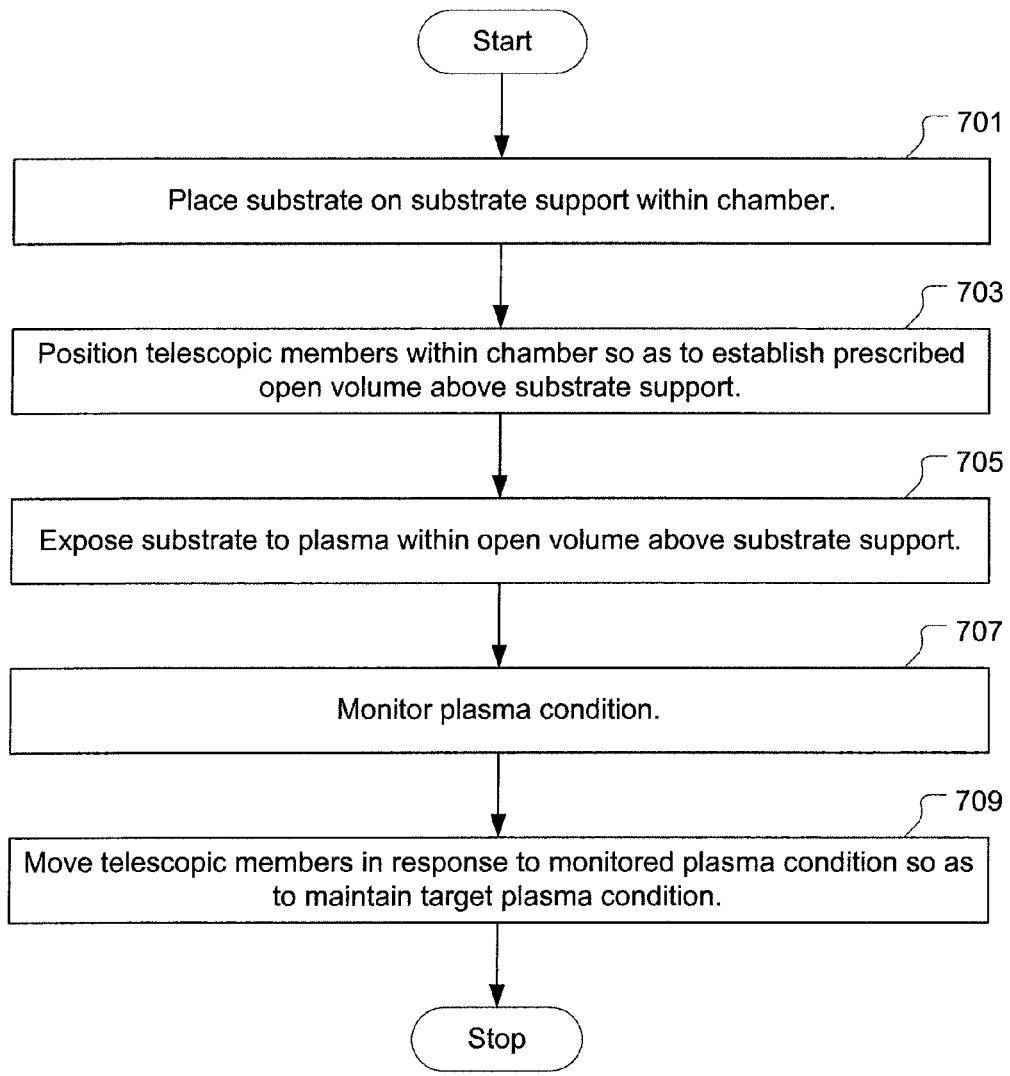
FIG. 7 is an illustration showing a flowchart of a method for substrate plasma processing, in accordance with one embodiment of the present invention.

FIG. 7 is an illustration showing a flowchart of a method for substrate plasma processing, in accordance with one embodiment of the present invention. The method includes an operation 701 in which a substrate is placed on a substrate support within a chamber. In an exemplary embodiment, the method of FIG. 7 is performed using the chamber 100 described herein. In an operation 703, a number of telescopic members disposed within the chamber outside a periphery of the substrate support are positioned so as to establish a prescribed open volume above the substrate support. The method further includes an operation 705 for exposing the substrate to a plasma within the open volume above the substrate support. In one embodiment, an operation 707 is performed to monitor a condition of the plasma within the chamber. An operation 709 is then performed to control movement of the telescopic members within the chamber in response to the monitored condition of the plasma so as to maintain a target plasma condition. In operation 709, the telescopic members are moved sequentially so as to avoid formation of a plasma pocket outside either of the telescopic members.

It should be understood that although the present invention has been described by way of example with regard to a plasma etch application, the present invention is not limited to use with a plasma etch application. The present invention can be used with essentially any type of plasma application. For example, the present invention may be used with a plasma enhanced chemical vapor deposition (PECVD) application or a metalorganic chemical vapor deposition (MOCVD) application, among others. Additionally, in non-plasma applications, such as chemical vapor deposition (CVD), dynamic variation of an open volume above a substrate being processed may effect process parameters that in turn cause process uniformity changes at the substrate level. Therefore, the volume variation capability provided by the telescopic members disclosed herein can be also be usefully implemented within non-plasma applications and associated devices.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention.

The invention claimed is:

1. A plasma processing chamber, comprising:
   a substrate support having a top surface defined to support a substrate in a substantially horizontal orientation within the chamber; and
   a plurality of telescopic members disposed within the chamber outside a periphery of the substrate support and concentric with both a center of the top surface of the substrate support and with each other, wherein each of the plurality of telescopic members is defined radially adjacent to its neighboring ones of the plurality of telescopic members such that a radial gap is not present between any neighboring ones of the plurality of telescopic members, wherein each of the plurality of telescopic members is defined to be independently moved in a substantially vertical direction relative to the top surface of the substrate support so as to enable adjustment of an open volume above the top surface of the substrate support, and wherein each of the plurality of telescopic members is structurally defined such that the plurality of telescopic members form a contiguous telescopic member arrangement at all vertical positions of the plurality of telescopic members.

2. A plasma processing chamber as recited in claim 1, wherein the plurality of telescopic members are defined as concentric cylinders.

3. A plasma processing chamber as recited in claim 1, wherein the plurality of telescopic members is three telescopic members.

4. A plasma processing chamber as recited in claim 1, wherein each of the plurality of telescopic members is defined to have a different radial thickness such that the radial thickness of the plurality of telescopic members increases with increased radial position relative to the substrate support.

5. A plasma processing chamber as recited in claim 1, wherein a telescopic member having a radial position closest to the substrate support includes an inner surface profile defined to optimize a radiofrequency power coupling uniformity and gas flow dynamics within the chamber.

6. A plasma processing chamber as recited in claim 1, wherein each of the plurality of telescopic members is formed from an electrically conductive material and is electrically connected to a ground potential.

7. A plasma processing chamber as recited in claim 1, wherein each of the number of telescopic members is formed from a dielectric material.

8. A plasma processing chamber as recited in claim 1, wherein at least one of the number of telescopic members is formed from a dielectric material and at least one of the number of telescopic members is formed from an electrically conductive material connected to a ground potential.

9. A plasma processing chamber as recited in claim 1, wherein a home position of the plurality of telescopic members is defined within an upper region of the chamber, each of the plurality of telescopic members defined to be independently moved downward from the home position so as to enable adjustment of the open volume above the top surface of the substrate support.

10. A plasma processing chamber as recited in claim 9, further comprising:
   a stepper motor mechanically connected to move each of the plurality of telescopic members, wherein the stepper motor is defined to limit movement of each of the plurality of telescopic members from the home position to a position of its immediately surrounding telescopic member.

11. A plasma processing chamber as recited in claim 1, wherein a home position of the number of telescopic members is defined within a region of the chamber below the top surface of the substrate support, each of the number of telescopic members defined to be independently moved upward from the home position so as to enable adjustment of the open volume above the top surface of the substrate support.

* * * * *